(12) United States Patent
Shimizu et al.

(10) Patent No.: US 8,652,764 B2
(45) Date of Patent: Feb. 18, 2014

(54) METHOD FOR MANUFACTURING A PIEZOELECTRIC MEMBRANE TYPE DEVICE

(75) Inventors: Hideki Shimizu, Ohbu (JP); Mutsumi Kitagawa, Inuyama (JP)

(73) Assignee: NGK Insulators, Ltd., Nagoya (JP)

( * ) Notice: Subject to any disclaimer, the term of this patent is extended or adjusted under 35 U.S.C. 154(b) by 340 days.

(21) Appl. No.: 13/076,826

(22) Filed: Mar. 31, 2011

(65) Prior Publication Data

US 2011/0278257 A1 Nov. 17, 2011

(30) Foreign Application Priority Data

Mar. 31, 2010 (JP) .................................. 2010-082371

(51) Int. Cl.
*G03F 1/00* (2012.01)
*G03F 7/00* (2006.01)

(52) U.S. Cl.
USPC ............................ 430/320; 430/311; 430/312

(58) Field of Classification Search
USPC ......................................... 430/311, 312, 320
See application file for complete search history.

(56) References Cited

U.S. PATENT DOCUMENTS

| 7,406,757 B2 | 8/2008 | Mita |
| 8,178,285 B2 * | 5/2012 | Shimizu et al. ............... 430/312 |
| 2006/0156546 A1 | 7/2006 | Yokouchi |
| 2009/0317750 A1 * | 12/2009 | Shimizu et al. ............... 430/319 |

FOREIGN PATENT DOCUMENTS

| JP | 10-181013 A1 | 7/1998 |
| JP | 2001-178162 A1 | 6/2001 |
| JP | 3340043 | 8/2002 |
| JP | 2006-218859 A1 | 8/2006 |
| JP | 2006-239958 A1 | 9/2006 |
| JP | 2007-090821 A1 | 4/2007 |
| WO | 2009/110543 A1 | 9/2009 |

* cited by examiner

*Primary Examiner* — Stewart Fraser
(74) *Attorney, Agent, or Firm* — Burr & Brown, PLLC

(57) ABSTRACT

A substrate 20 is prepared. "A piezoelectric material layer 32a which has not been fired" and which will become a piezoelectric membrane is formed above a first principal surface 20a of the substrate 20. A first mask 131 is formed above the piezoelectric material layer 32a. "The piezoelectric material layer 32a existing within a portion where the first mask 131 does not exist" is eliminated by injecting a blast media including at least one of abrasive grains or an organic solvent onto the first principal surface 20a of the substrate 20. Thereafter, the first mask 131 is eliminated, and the piezoelectric material layer 32a is fired. The substrate has a hollow portion, however, it does not necessarily have the hollow portion.

21 Claims, 18 Drawing Sheets

17. Piezoelectric material layer processing
(Blast processing, Piezoelectric material layer elimination)

1. Substrate preparing

2. Third photosensitive film forming

3. Light shielding material (Third light shielding material) filling

4. Third photosensitive film exposure (Third exposure step)

Irradiation Light

5. Non-exposed portion of third photosensitive film elimination
(Completion of third mask)

6. Light shielding material (Third light shielding material) elimination

7. Conductive material film forming
(Conductive film for first electrode forming)

8. Third mask elimination (and Conductive film for first electrode firing)

9. Second photosensitive film forming

10. Second photosensitive film exposure (Second exposure step)

Irradiation Light

11. Non-exposed portion of second photosensitive film elimination
(Completion of second mask)

12. Piezoelectric material layer forming

13. First photosensitive film forming

14. First photosensitive film exposure (First exposure step)

Irradiation Light

15. Exposed portion of first photosensitive film elimination
(Completion of first mask)

16. Support forming

17. Piezoelectric material layer processing
(Blast processing, Piezoelectric material layer elimination)

18. Support elimination

19. First mask elimination, Second mask elimination

20. Second conductive material film forming
(Conductive film for second electrode forming)

1. Substrate preparing

2. Lower electrode(s) forming

3. Eleventh photosensitive film forming

4. Eleventh photosensitive film exposure

5. Non-exposed portion of the eleventh photosensitive film eliminating

6. Piezoelectric material layer forming

7. Twelfth photosensitive film forming

8. Twelfth photosensitive film exposure

9. Exposed portion of the twelfth photosensitive film eliminating

10. Piezoelectric material layer processing
(Blast processing, Piezoelectric material layer eliminating)

11. Mask eliminating

12. Upper electrode(s) forming

METHOD FOR MANUFACTURING A PIEZOELECTRIC MEMBRANE TYPE DEVICE

TECHNICAL FIELD

The present invention relates to a method for manufacturing a piezoelectric membrane type device.

DESCRIPTION OF RELATED ART

A piezoelectric membrane type device is known, which comprises a substrate having a hollow portion (cavity) and a piezoelectric device formed on the substrate. The piezoelectric device includes a first electrode, a second electrode, and a piezoelectric membrane (film) sandwiched between the first electrode and the second electrode. In the piezoelectric membrane type device, the piezoelectric membrane is extended and shrunk by a voltage supplied between the first electrode and the second electrode. As a result, a part (e.g., a vibration plate) of the substrate, the part constituting a portion of the hollow portion deforms, so that a volume of the hollow portion changes. Such a piezoelectric membrane type device is used as an ink jet actuator for a printer, for example.

It should be noted that "piezoelectric" and "electrostrictive" are expressed as "piezoelectric", for the sake of convenience, in the present specification, the attached patent claims, and the drawings (hereinafter, referred to as "the present specification etc."). Accordingly, for example, "a piezoelectric device" may include both "a device (piezoelectric device) utilizing a piezoelectric effect and a device (electrostrictive device) utilizing an electrostrictive effect", and "a piezoelectric membrane" may include both "a piezoelectric membrane and an electrostrictive membrane", in the present specification etc. "A piezoelectric membrane type device" in the present specification etc. may include both "a device comprising the piezoelectric device and a device comprising the electrostrictive device".

In one of conventional methods for manufacturing the piezoelectric membrane type device, the substrate having the hollow portion and the piezoelectric device including a fired piezoelectric membrane are joined. Thereafter, a mask is formed on the piezoelectric device, and a portion of the piezoelectric device on which the mask is not formed is eliminated by injecting fine particles (abrasive grains, powder). That is, so called "blast processing" is used to process the piezoelectric device (e.g., refer to, for example, Patent Document No. 1)

Typically, the mask (the mask for the blast processing) is formed as follows.
(1) A photosensitive resin is applied onto the whole surface of the piezoelectric device to thereby form a photosensitive resin layer.
(2) A cover having a predetermined shape is provided on the photosensitive resin layer.
(3) A light is irradiated onto the piezoelectric device from a position above the cover to expose the photosensitive resin layer.
(4) Either one of "a part of the photosensitive resin layer which was exposed" and "a part of the photosensitive resin layer resign which was not exposed due to the cover" is eliminated to thereby form the mask.

PRIOR ART DOCUMENT

Patent Document

Patent Document No. 1
Japanese Patent No. 3340043 (paragraphs 0040, and 0042, and so on).

SUMMARY OF THE INVENTION

The piezoelectric device including the fired piezoelectric membrane has a high hardness. Further, when a fine piezoelectric device is formed by the blast processing, it is difficult to use abrasive grains whose diameters are large, set an injection pressure at a very high pressure, or the like. As a result, according to the conventional method, the blast processing takes a long time, and the production efficiency is therefore not desirable. In view of the above, one of objects of the present invention is to provide a manufacturing method for manufacturing a piezoelectric membrane type device, which allows the piezoelectric membrane type device to be efficiently manufactured.

The method for manufacturing a piezoelectric membrane type device according to the present invention (hereinafter, referred simply to as "the present manufacturing method") is a method for manufacturing a piezoelectric membrane type device which includes a substrate, and a piezoelectric device having a piezoelectric membrane and provided (placed) on a first principal surface of the substrate, the method comprising, (a) a substrate preparing step of preparing the substrate;
(b) a piezoelectric material layer forming step of forming, above the first principal surface of the substrate, a piezoelectric material layer which is a layer including a piezoelectric material to be changed into the piezoelectric membrane by being fired;
(c) a first mask forming step of forming a first mask above the piezoelectric material layer;
(d) a piezoelectric material layer processing step of eliminating the piezoelectric material layer existing in a portion on which the first mask does not exist by injecting a blast media including at least one of abrasive grains and an organic solvent to the first principal surface of the substrate;
(e) a first mask eliminating step of eliminating the first mask; and
(f) a firing step of firing the piezoelectric material layer.

According the present manufacturing method, the piezoelectric material layer is formed above the first principal surface (an upper surface) of the substrate (refer to the piezoelectric material layer forming step (b)). The piezoelectric material layer is a layer which will change into the piezoelectric membrane by the firing, and which includes the piezoelectric material which has not been fired. Subsequently, the first mask is formed above the piezoelectric material layer (refer to the first mask forming step (c)). Thereafter, the blast media including at least one of the abrasive grains and the organic solvent is injected to the first principal surface of the substrate to eliminate the piezoelectric material layer existing in the portion on which the first mask does not exist (refer to the piezoelectric material layer processing step (d)). That is, the process corresponding to the blast processing is performed on "the piezoelectric material layer which has not been fired (piezoelectric material layer before fired)". The piezoelectric material layer before fired has a lower hardness compared with the fired piezoelectric membrane (the piezoelectric membrane after fired), and the piezoelectric material layer before fired can therefore be easily processed by the injection of the blast media. Accordingly, the blast processing can be performed with high processing rate. As a result, the piezoelectric membrane type device can be efficiently manufactured.

Meanwhile, in the piezoelectric membrane type device whose substrate having a hollow portion, it is important that the piezoelectric device is formed within a range onto which the hollow portion of the substrate is projected in a direction orthogonal to (perpendicular to) "the first principal surface (e.g., a plane on which a vibration plate exists) of the substrate". Hereinafter, the direction orthogonal to the first principal surface of the substrate is referred to as "a first principal surface orthogonal direction". Further, "a spatial region obtained by (as a result of) extending an image in the first principal surface orthogonal direction, the image being an image obtained by projecting the hollow portion in the first principal surface orthogonal direction onto the first principal surface" is referred to as "a hollow portion projected region". If the piezoelectric device is formed in a region deviated (or apart) from the hollow portion projected region, a deformation amount of the vibration plate becomes different from a desired amount. As a result, the piezoelectric membrane type device can not deliver the desired or designed performance.

Furthermore, for example, in the ink jet actuator, etc., a plurality of hollow portions are provided in the substrate, and each of the piezoelectric devices is provided within each of the hollow portion projection regions corresponding to the plurality of hollow portions. In this case, if each of actual positions of the piezoelectric devices with respect (or relative to) each of the hollow portion projection regions is different among a plurality of the hollow portions, there may be differences in capability of injecting the ink among a plurality of the hollow portions. Accordingly, a manufacturing method which allows the piezoelectric device to be formed accurately "on the first principal surface and within the hollow portion projection region" is required. Such a method becomes more important, when the piezoelectric membrane type device is downsized.

According to the conventional manufacturing method described above, accuracy (precision) of the position of the piezoelectric device depends on accuracy of the position of the mask for the blast processing. Further, the accuracy of the position of the mask for the blast processing depends on accuracy of the position of the cover. Typically, the cover is formed at a position referring to a reference marking provided on the upper surface of the substrate. It is therefore not easy to have the position of the existence of the cover coincide with the hollow portion projection region with high accuracy. This is because, for example, a shape itself of the hollow portion is not always identical or constant, and/or a relative positional relationship between the hollow portion and the reference marking is not always identical or constant. As a result, there may be a case in which the piezoelectric device can not be formed in such a manner that the existing region of the piezoelectric device accurately coincides with the hollow portion projection region.

In view of the above, another object of the present invention is to provide a manufacturing method which allows the piezoelectric membrane type device to be efficiently formed in such a manner that the existing region of the piezoelectric device coincides with the hollow portion projection region on the upper surface of the substrate with high accuracy.

In this case, the substrate has the hollow portion.

The piezoelectric device comprises a first electrode, a second electrode, and the piezoelectric membrane which is sandwiched between the first electrode and the second electrode. Further, the piezoelectric device is disposed (arranged) in such a manner that the piezoelectric device coincides with the spatial region (the hollow portion projected region) obtained by (as a result of) extending the image along the direction orthogonal to the first principal surface (the first principal surface orthogonal direction), the image being the image obtained by projecting the hollow portion in the first principal surface orthogonal direction onto the first principal surface. That is, the piezoelectric device is formed in such a manner that a position and an outline (or a profile, a shape) of the piezoelectric device coincide with a position and an outline of the hollow portion projected region, respectively, when viewed in plan. In addition, the piezoelectric membrane type device changes a volume of the hollow portion in accordance with expansion and contraction of the piezoelectric device based on application of a voltage between the first electrode and the second electrode.

Further, the substrate preparing step (a) is a step of preparing the substrate having the hollow portion, and the first mask forming step (c) includes,
- (c1) a photosensitive film forming step of forming a first photosensitive film above the piezoelectric material layer;
- (c2) a first exposure step of exposing the first photosensitive film existing outside of the hollow portion projected region without exposing the first photosensitive film existing inside of the hollow portion projected region by irradiating a light parallel to the first principal surface orthogonal direction to the substrate from a side of a second principal surface of the substrate, the second principal surface being opposed to the first principal surface; and
- (c3) an exposed first photosensitive film eliminating step of eliminating the exposed first photosensitive film to form a first mask on (above) an upper surface of the piezoelectric material layer.

In other words, the present manufacturing method includes,
- (a) a substrate preparing step of preparing the substrate having the hollow portion;
- (b) a piezoelectric material layer forming step of forming, above the first principal surface of the substrate, a piezoelectric material layer which is a layer containing a piezoelectric material which has not been fired and will change into the piezoelectric membrane by being fired;
- (c1) a photosensitive film forming step (a first photosensitive film forming step) of forming a first photosensitive film above the piezoelectric material layer;
- (c2) a first exposure step of exposing the first photosensitive film existing outside of the hollow portion projected region without exposing the first photosensitive film existing inside of the hollow portion projected region by irradiating a light parallel to the first principal surface orthogonal direction to the substrate from a side of a second principal surface of the substrate opposed to the first principal surface;
- (c3) an exposed first photosensitive film eliminating step of forming a first mask on an upper surface of the piezoelectric material layer by eliminating the exposed first photosensitive film;
- (d) a piezoelectric material layer processing step of eliminating the piezoelectric material layer existing in a portion on which the first mask does not exist by injecting a blast media including at least one of abrasive grains and an organic solvent to the first principal surface of the substrate; and
- (e) a first mask eliminating step of eliminating the first mask; and
- (f) a firing step of firing the piezoelectric material layer.

It should be noted that the photosensitive film forming step (c1), the first exposure step (c2), and the exposed first photosensitive film eliminating step (c3) are included in the first mask forming step (c).

According to the present manufacturing method, the piezoelectric material layer is formed above the first principal surface (the upper surface) of the substrate having the hollow portion (refer to the piezoelectric material layer forming step (b)). Subsequently, the first photosensitive film is formed on the upper surface of the piezoelectric material layer (refer to the photosensitive film forming step (c1)).

Thereafter, the light is irradiated to (or toward) the substrate (to the first principal surface) from the side of the second principal surface of the substrate, the second principal surface being opposed to the first principal surface, in the first exposure step (c2). An irradiation direction of the light is parallel to the first principal surface orthogonal direction.

In this case, a material (a substance) containing a light shielding material (an opaque material) may be introduced (or filled) into the hollow portion, before the first exposure step (c2).

Alternatively, before the piezoelectric material layer forming step (b), a material containing a light shielding material may be introduced (filled) into the hollow portion, and a photosensitive film (referred to as "a third photosensitive film", for convenience) may be formed on the upper surface of the substrate;

the third photosensitive film existing outside of the hollow portion projected region may be exposed without exposing the third photosensitive film existing inside of the hollow portion projected region by irradiating a light parallel to the first principal surface orthogonal direction to the substrate from the side of the second principal surface;

a mask (referred to as "a third mask", for convenience) may be formed on the upper surface of the substrate by eliminating the non-exposed third photosensitive film;

a conductive material film which will become the first electrode may be formed on the first principal surface of the substrate and at a portion where the third mask does not exist; and thereafter, and the third mask may be eliminated to thereby form the conductive material film which becomes the first electrode inside of the hollow portion projected region.

Alternatively, it is preferable to introduce (fill) a material containing a light shielding material into the hollow portion before the irradiation of the light in the first exposure step (c2), and to form the conductive material film which will become the first electrode inside of the hollow portion projected region according to the above describe method.

In any one of cases, in which the material (the opaque material) containing the light shielding material is introduced into the hollow portion, in which the conductive material film is formed, and in which the material containing the light shielding material is introduced into the hollow portion and the conductive material film is formed, the light irradiated to the substrate from the side of the second principal surface in the first exposure step (c2) can not reach the portion inside of the hollow portion projected region due to the opaque material and/or the conductive material film. In other words, the light irradiated from the side of the second principal surface in the first exposure step (c2) can reach the portion outside of the hollow portion projected region only.

The first exposure step (c2) is a step which may include any one of the aspects described above. That is, the first exposure step is a step to expose the first photosensitive film existing outside of the hollow portion projected region without exposing the first photosensitive film existing inside of the hollow portion projected region owing to the light irradiated to the substrate from the side of the second principal surface of the substrate. As a result, "a position and a shape when viewed in plan (the position and the shape viewed along the first principal surface orthogonal direction)" of the portion which is not exposed of the first photosensitive film coincide with the position and the shape of the hollow portion when viewed in plan, respectively, with extremely high accuracy.

Thereafter, in the exposed first photosensitive film eliminating step (c3), the portion of the first photosensitive film which has been exposed is eliminated, and therefore the portion of the photosensitive first film which has not been exposed is left (remains) as the first mask. As a result, a position and a shape of the first mask when viewed in plan coincide with the position and the shape of the hollow portion when viewed in plan, respectively, with extremely high accuracy.

Subsequently, in the piezoelectric material layer processing step (d), the blast media including at least one of the abrasive powder (grains) and the organic solvent is injected (blasted) toward the first principal surface of the substrate. As a result, a portion of the piezoelectric material layer existing in an area in which the first mask does not exist is eliminated, and a portion of the piezoelectric material layer existing in an area in which the piezoelectric material layer is covered by the first mask is left (remained). As described above, the position and the shape of the first mask in a plan view coincide with the position and the shape of the hollow portion in a plan view, respectively, with extremely high accuracy. Accordingly, the piezoelectric material layer is formed (processed) in such a manner that a position and a shape of the piezoelectric material layer in a plan view coincide with the position and the shape of the hollow portion in a plan view, respectively, with extremely high accuracy. In other words, the piezoelectric material layer is formed in such a manner that the piezoelectric material layer accurately exists only in (at) an area inside of the hollow portion projected region above the first principal surface of the substrate. As a result, it is possible for an area where the piezoelectric material layer exists to coincide with "the hollow portion projected region on the upper surface of the substrate".

Further, an object to be processed in the piezoelectric material layer processing step (d) is the piezoelectric material layer which has not been fired yet (for example, a ceramic green sheet). The piezoelectric material layer which has not been fired yet (the piezoelectric material layer before fired) has a lower hardness compared to a piezoelectric material layer which has been fired (the piezoelectric material layer after fired), and therefore the piezoelectric material layer before fired can be eliminated (removed) within a shorter time period by the injection of the blast media. As a result, a time required to complete or perform the piezoelectric material layer processing step (d) can be shortened.

The present manufacturing method may include,
(g) a second mask forming step; and
(h) a second mask eliminating step.

The second mask forming step (g) is carried out after the substrate preparing step (a) and before the piezoelectric material layer forming step (b).

The second mask forming step (g) is a step to form a second mask above the substrate, by forming a second photosensitive film above the first principal surface of the substrate;

thereafter, exposing the second photosensitive film existing outside of the hollow portion projected region without exposing the second photosensitive film existing inside of the hollow portion projected region by irradiating a light parallel to the first principal surface orthogonal direction to the substrate from the side of the second principal surface; and thereafter, eliminating the non-exposed second photosensitive film (the portion of the second photosensitive film which has not been exposed).

The exposure of the second photosensitive film in the second mask forming step (g) may be carried out so as to include, similarly to the first exposure step (c2), any one of aspects including;

an aspect in which the light is irradiated from the side of the second principal surface under a condition that (while) the light shielding material (the opaque material) is filled (maintained) in the hollow portion;

an aspect in which the light is irradiated from the side of the second principal surface under a condition that (while) the conductive material film is formed; and an aspect in which the light is irradiated from the side of the second principal surface under a condition that (while) the light shielding material (the opaque material) is filled (maintained) in the hollow portion and the conductive material film is formed.

The second mask eliminating step (h) is carried out after the piezoelectric material layer processing step (d). The second mask eliminating step (h) is a step to eliminate the second mask.

By the same reason regarding the first mask, a position and a shape of the second mask when viewed in plan coincide with a shape and a position of a portion (non-hollow-portion) where the hollow portion is not formed in the substrate when viewed in plan, respectively, with extremely high accuracy.

Because the second mask forming step (g) is carried out before the piezoelectric material layer forming step (b), the piezoelectric material layer is formed so as to cover the second mask. Further, because the second mask eliminating step (h) is carried out after the piezoelectric material layer processing step (d), the second mask exists when the piezoelectric material layer processing step (d) is carried out. Accordingly, a thickness of the piezoelectric material layer which needs to be eliminated by the injection of the blast media in the piezoelectric material layer processing step (d) is smaller by a thickness of the second mask than in a case where the second mask is not formed. As a result, it is possible to finish the elimination of the piezoelectric material layer within a short time period.

The aspect described above is especially advantageous, when an eliminating rate of the piezoelectric material layer is small, such as when the piezoelectric material layer is eliminated with abrasive grains whose particle diameter is small, and when the piezoelectric material layer is eliminated with the organic solvent only. That is, the elimination of the piezoelectric material layer can be finished within a relatively short time period even when the eliminating rate (the processing rate) of the piezoelectric material layer is low, because the thickness of the piezoelectric material layer to be eliminated is small. Accordingly, it is possible for the piezoelectric material layer to be processed in a short time while maintaining high accuracy in processing the piezoelectric material layer.

It is preferable that another aspect of the present manufacturing method described above further include;

(i) a support forming step; and
(j) a support eliminating step.

The support forming step (i) is carried out before the piezoelectric material layer processing step (d).

The support forming step (i) is a step of introducing (filling) a fluidic material into the hollow portion and hardening the fluidic material to form a support in the hollow portion.

The support eliminating step (j) is carried out after the piezoelectric material layer processing step (d). The support eliminating step (j) is a step of eliminating the support (from the hollow portion).

In the piezoelectric material layer processing step (d), the blast media is injected (blasted). As a result, a pressure is applied to a portion constituting the first principal surface of the substrate. On the other hand, a part of the substrate, the part constituting the hollow portion and the first principal surface (i.e., a boundary portion between the hollow portion and the piezoelectric device) is typically (often) "a thin plate whose strength is relatively low" in order for the volume of the hollow portion to be easily changed. This may cause the boundary portion between the hollow portion and the piezoelectric device to deform or break due to the pressure applied during the injection of the blast media.

The aspect described above can cope with the problem described above. That is, according to the aspect, the blast media is injected under the condition that (while) "the hardened body" is formed in the hollow portion. As a result, it is possible to avoid that the boundary portion between the hollow portion and the piezoelectric device deforms or breaks out.

It is preferable that another aspect of the present manufacturing method described above further include;

(k) a support forming step of forming a support having a light shielding function in the hollow portion before the first exposure step (c2) by introducing a fluidic material containing a light shielding material into the hollow portion and hardening the fluidic material; and (l) a support eliminating step of eliminating the support after the piezoelectric material layer processing step (d).

According to the aspect described above, the blast media is injected under the condition that (while) "the hardened support" is formed in the hollow portion. As a result, it is possible to avoid that the boundary portion between the hollow portion and the piezoelectric device deforms or breaks out.

Furthermore, the support forming step (k) is carried out before the first exposure step (c2). Accordingly, when the light is irradiated to the substrate from the second principal surface of the substrate in the first exposure step (c2), the hardened body (the mask) containing the light shielding material exists in the hollow portion. It is therefore possible to improve accuracy in the position and the shape of the first photosensitive film which is exposed in the first exposure step (c2).

Moreover, by the single support forming step (k), "the hardened body containing the light shielding material serving as a mask during the exposure in the first exposure step (c2)" and "the hardened body serving as a support which avoids the deformation or the breakage of the boundary portion during the injection of the blast media in the piezoelectric material layer processing step (d)" can be simultaneously formed in the hollow portion. As a result, the manufacturing processes are simplified.

It is preferable that still another aspect of the present manufacturing method further include;

(m) a third mask forming step; and
(n) a conductive material film forming step.

The third mask forming step (m) is carried out after the substrate preparing step (a) and before piezoelectric material layer forming step (b).

The third mask forming step (m) is a step of forming a third mask above the substrate, by introducing (filling) a material containing a light shielding material into the hollow portion, and forming a third photosensitive film above the first principal surface of the substrate;

thereafter, exposing the third photosensitive film existing outside of the hollow portion projected region without exposing the third photosensitive film existing inside of the hollow portion projected region by irradiating a light parallel to the first principal surface orthogonal direction to the substrate from the side of the second principal surface; and thereafter, eliminating the non-exposed third photosensitive film (the portion of the third photosensitive film which has not been exposed).

By the same reason regarding the first mask, a position and a shape of the third mask, formed in the third mask forming step (m), when viewed in plan, coincide with the position and the shape of the portion (non-hollow-portion) where the hollow portion is not formed in the substrate when viewed in plan, respectively, with extremely high accuracy.

The conductive material film forming step (n) is carried out after the third mask forming step (m) and before the piezoelectric material layer forming step (b). Accordingly, the conductive material film forming step (n) is carried out before the first exposure step (c2).

The conductive material film forming step (n) is a step of forming a conductive material film which will become the first electrode on the first principal surface of the substrate and at a portion where the third mask does not exist.

As described above, the conductive material film to be the first electrode is formed along the third mask. It is therefore possible for a position and a shape of the conductive material film to be formed so as to coincide with the position and the shape of the hollow portion, when viewed in plan, with extremely high accuracy.

The aspect described above may further include a third mask eliminating step (o) of eliminating the third mask after the conductive material film forming step (n) and before the piezoelectric material layer forming step (b).

In this case, the first exposure step (c2) is preferably a step for exposing the first photosensitive film while utilizing the conductive material film as a mask.

As described above, the position and the shape of the conductive material film formed using the third mask when viewed in plan coincide with the position and the shape of the hollow portion when viewed in plan, respectively, with extremely high accuracy. Accordingly, when the light is irradiated to the substrate from the side of the second principal surface of the substrate in the first exposure step (c2), accuracy in the position and the shape of the first photosensitive film which is exposed can be improved by using the conductive material film as "the mask to shield/block the light".

Further, in the aspect (which includes the third mask eliminating step (o)), the first exposure step (c2) may be a step of exposing the first photosensitive film while utilizing, in addition to the conductive material film, the light shielding material introduce into the hollow portion in the third mask forming step (m) as a mask.

This aspect allows, in addition to the conductive material film, the light shielding material which is introduced (filled) into the hollow portion and is used to form the third mask in order to form the conductive material layer to serve as the mask in the first exposure step. Further, the light irradiated in the first exposure step (c2) can be more certainly shielded/blocked by "the conductive material layer" and "the light shielding material which is introduced (filled) into the hollow portion and is used to form the third mask". Therefore, the accuracy of the position and the shape of the first photosensitive film exposed by the light can be improved.

Further, if the material containing the light shielding material introduced into the hollow portion in the third mask forming step (m) is a fluidic material, the third mask forming step (m) may include forming a hardened body by hardening the fluidic material introduced into the hollow portion before the irradiation of the light to expose the third photosensitive film; and the piezoelectric material layer processing step (d) may be a step of injecting the blast media under a condition that (while) the hardened body formed in the third mask forming step (m) is maintained in the hollow portion.

According to this aspect, the light shielding material introduced into the hollow portion, which is used when forming the third mask to form the conductive material layer can be used as "the hardened body serving as the support to avoid the deformation or the breakage of the boundary portion" during the injection of the blast media in the piezoelectric material layer processing step (d). That is, the light shield used in the third mask forming step (m), the light shield used in the first exposure step (c2), and the support used in the piezoelectric material layer processing step (d) can be formed in a single step. As a result, the manufacturing processes can be simplified.

Alternatively, further, if the material containing the light shielding material introduced into the hollow portion in the third mask forming step (m) is a fluidic material; the aspect of the present manufacturing method may include (p) a first hardened body forming step of forming a first hardened body by hardening the fluidic material introduced into the hollow portion in the third mask forming step (m), after the third mask forming step (m) and before the piezoelectric material layer processing step (d).

In this case, the piezoelectric material layer processing step (d) may be a step of injecting the blast media under a condition that (while) the first hardened body is maintained in the hollow portion.

According to the above aspect, the light shielding material introduced into the hollow portion, which is used when forming the third mask to form the conductive material layer, can be used as "the hardened body serving as the support to avoid the deformation or the breakage of the boundary portion" during the injection of the blast media in the piezoelectric material layer processing step (d). That is, a material for the light shield used in the third mask forming step (m), a material for the light shield used in the first exposure step (c2), and a material for the support used in the piezoelectric material layer processing step (d) can be introduced into the hollow portion in a single step. As a result, the manufacturing processes can be simplified.

On the other hand, "the light shielding material in the hollow portion, light shielding material being used in the third mask forming step" may be eliminated, and "a light shielding material" which is different from the eliminated light shielding material may be re-filled into the hollow portion, and thereafter the first exposure step may be carried out.

That is, another aspect of the present manufacturing method may include steps of;

(q) a material for exposure of the third photosensitive film eliminating step of eliminating the material containing the light shielding material introduced into the hollow portion in the third mask forming step (m) from the hollow portion after the third mask forming step (m) and before the first exposure step (c2); and (r) a light shielding material re-filling step of re-filling a material containing a light shielding material into the hollow portion after the material for exposure of the third photosensitive film eliminating step (q) and before the first exposure step (c2).

In this aspect, the first exposure step (c2) may be a step of exposing the first photosensitive film while utilizing, in addition to the conductive material film, the light shielding material re-filled into the hollow portion in the light shielding material re-filling step (r) as a mask.

In this case, if the material containing the light shielding material re-filled into the hollow portion in the light shielding material re-filling step (r) is a fluidic material, the aspect may include (s) a second hardened body forming step of forming a second hardened body by hardening the fluidic material re-filled into the hollow portion in the light shielding material re-filling step (r) after the light shielding material re-filling step (r) and before the piezoelectric material layer processing step (d).

In this case, it is preferable that the piezoelectric material layer processing step (d) be a step of injecting the blast media under a condition that (while) the second hardened body is maintained in the hollow portion.

According to the above aspect, the material in the hollow portion used as the mask in the first exposure step (c2) (i.e., the light shielding material re-filled into the hollow portion in the light shielding material re-filling step (r)) can be used as the support used in the piezoelectric material layer processing step (d). That is, the material of the light shield used in the first exposure step (c2) and the material of the support used in the piezoelectric material layer processing step (d) can be introduced into the hollow portion in a single step. As a result, the manufacturing processes can be simplified.

Further, a second mask forming step (t), and a second mask eliminating step (u) may be included.

The second mask forming step (t) is carried out after the third mask eliminating step (o) and before the piezoelectric material layer forming step (b).

The second mask forming step (t) is a step of forming a second mask on the upper surface of the substrate, by forming a second photosensitive film above the first principal surface of the substrate;

thereafter, irradiating a light parallel to the first principal surface orthogonal direction to the substrate from the side of the second principal surface to expose the second photosensitive film existing outside of the hollow portion projected region without exposing the second photosensitive film existing inside of the hollow portion projected region using at least the conductive material film as a mask; and thereafter, eliminating the non-exposed second photosensitive film (a portion of the second photosensitive film which has not been exposed).

The second mask eliminating step (u) is carried out after the piezoelectric material layer processing step (d).

The second mask eliminating step (u) is a step of eliminating the second mask.

By the same reason regarding the first mask, a position and a shape of the second mask formed in the second mask forming step (t) when viewed in plan coincide with the position and the shape of the non-hollow-portion of the substrate when viewed in plan, respectively, with extremely high accuracy.

Because the second mask forming step (t) is carried out before the piezoelectric material layer forming step (b), the piezoelectric material layer is formed so as to cover the second mask. In addition, because the second mask eliminating step (u) is carried out after the piezoelectric material layer processing step (d), the second mask exists when the piezoelectric material layer processing step (d) is carried out.

Accordingly, a thickness of the piezoelectric material layer which should be eliminated by the injection of the blast media in the piezoelectric material layer processing step (d) becomes smaller by "a thickness of the second mask" than in a case where the second mask is not formed. As a result, it is possible to finish the elimination of the piezoelectric material layer within a short time period.

Further, the present manufacturing method may include (v) a middle layer forming step of forming a middle layer for reaction prevention to avoid occurring, on the upper surface of the piezoelectric material layer, of dissolution reaction caused by a contact between the piezoelectric material layer and the first photosensitive film, after the piezoelectric material layer forming step (b) and before the photosensitive film forming step (c1).

In this case, it is preferable that the exposed first photosensitive film eliminating step (c3) include a middle layer for reaction prevention eliminating step of eliminating the middle layer for reaction prevention existing outside of the hollow portion projected region without eliminating the middle layer for reaction prevention existing inside of the hollow portion projected region. It should be noted that the middle layer for reaction prevention may be eliminated in the piezoelectric material layer processing step (g), for example.

When the first photosensitive film is formed directly on the piezoelectric material layer, the dissolution reaction between the piezoelectric material layer and the first photosensitive film may occur, and thereby, a part (an upper portion) of the piezoelectric material layer and a part (a lower portion) of the first photosensitive film may be integrated (united). In this case, it is difficult to eliminate the first mask only in the first mask elimination step (e), and therefore the piezoelectric material layer may be eliminated together with the first mask.

In view of the above, the middle layer for reaction prevention is formed above the piezoelectric material layer in the middle layer forming step (v), and thereafter, the first photosensitive film is formed. This can avoid the occurrence of the dissolution reaction between the piezoelectric material layer and the first photosensitive film, and therefore, only the first mask can be easily eliminated in the first mask eliminating step (e).

The substrate of the piezoelectric membrane type device manufactured by the present manufacturing method may comprise a plurality of the hollow portions. In this case, the substrate preparing step (a) may be a step of forming the substrate in such a manner that the plurality of the hollow portions are arranged with a predetermined interval (distance, space) therebetween in a direction along the first principal surface.

According to the present manufacturing method, the piezoelectric membrane type device including the piezoelectric membranes can be formed in such a manner that the piezoelectric membrane is formed within the hollow portion projected portion with high accuracy. Accordingly, in a case where the substrate includes the plurality of hollow portions, each of characteristics in volume change of each of the hollow portions can be coincided with each other. Therefore, the present manufacturing method may be preferably used when manufacturing the piezoelectric membrane type device (e.g., the ink jet actuator) has a plurality of the hollow portions and a plurality of piezoelectric devices, each of which is formed inside of each of the hollow portion projected portions corresponding to each of the plurality of the hollow portions.

Meanwhile, according to the conventional manufacturing method, the piezoelectric device which was fired is processed using the blast processing. The piezoelectric device which was fired has the high hardness. Accordingly, there arises a problem that it takes a long time to complete the blast processing. It seems therefore effective to use abrasive grain having a large particle diameter. However, if the particle diameter of the abrasive grain is large, a fine processing becomes difficult. Accordingly, when the substrate includes a plurality of hollow portions and a distance between adjacent hollow portions is small, the abrasive grain having a large particle diameter can not be used. As a result, the blast processing requires a long time.

In contrast, each of the aspects according to the present invention eliminates the piezoelectric material layer which has not been fired in the piezoelectric material layer processing step (d). The piezoelectric material layer which has not been fired has a lower hardness than the piezoelectric material layer which has been fired. Accordingly, each of the aspects can shorten the time required for the piezoelectric material layer processing step (d), even if the particle diameter of the abrasive grain is small, or the piezoelectric material layer is eliminated by the organic solvent only. As a result, by each of the aspects according to the present invention, it is possible to efficiently manufacture the piezoelectric membrane type device having the fine pattern, such as the device having a pattern whose interval (distance) between adjacent hollow portions is small.

DETAILED DESCRIPTION OF THE INVENTION

Embodiments and modified embodiments according to the present invention will next be described with reference to the drawings. It should be noted that the present invention is not limited to the embodiments and the modified embodiments, and various changes, modifications, and improvements can be employed within the scope of the present invention based on knowledge of a person having ordinal skill in the art.

First Embodiment

Figure 1:
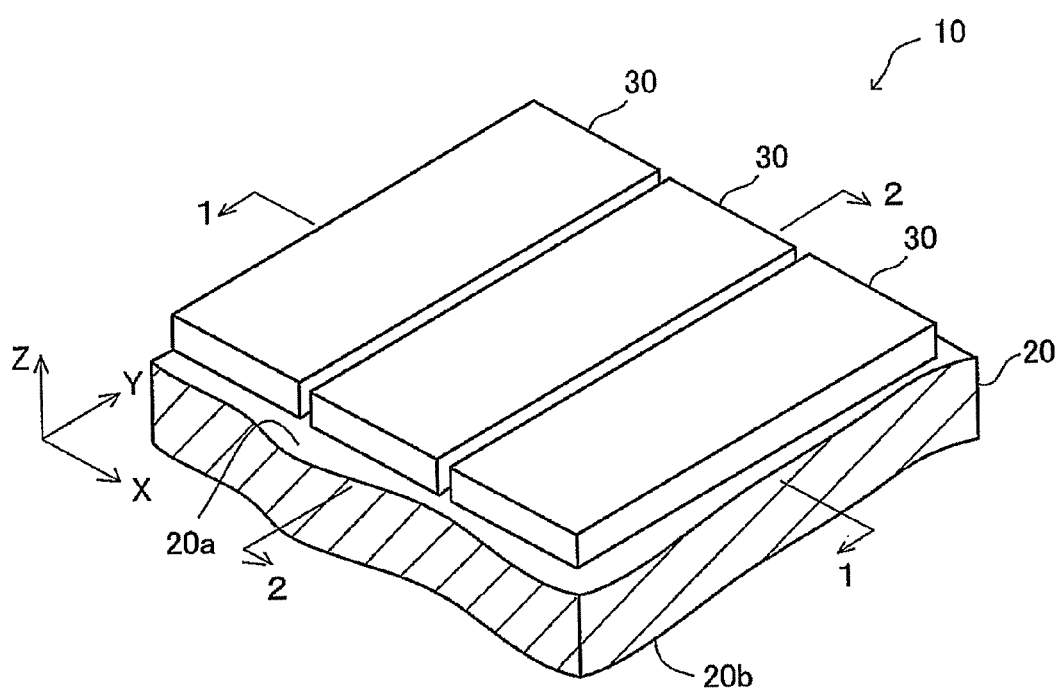
FIG. 1 shows a diagrammatic perspective view of a piezoelectric membrane type device manufactured by a method for manufacturing a piezoelectric membrane type device according to a first embodiment (a first manufacturing method) of the present invention.
Figure 2:
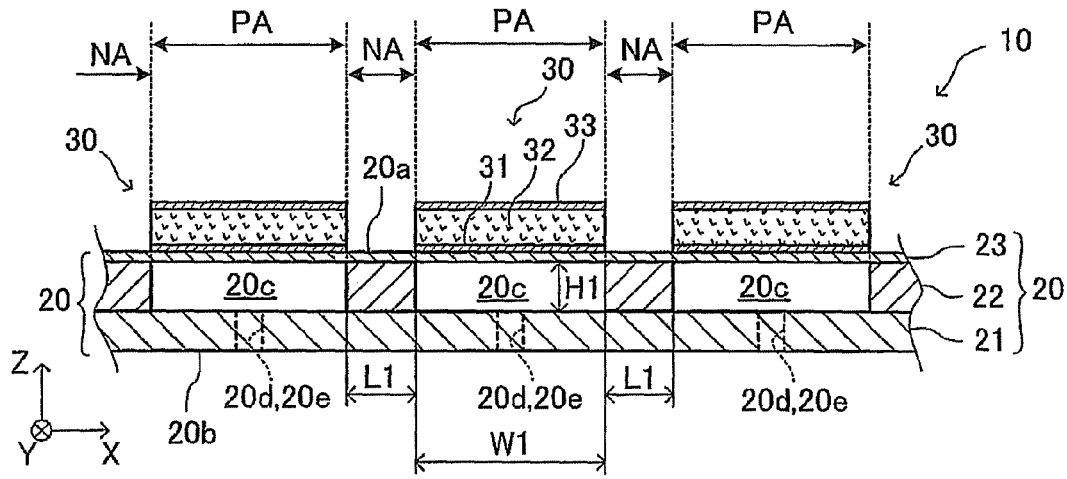
FIG. 2 is a cross sectional view of the piezoelectric membrane type device shown in FIG. 1, cut by a plane along line 1-1 of FIG. 1.
Figure 3:
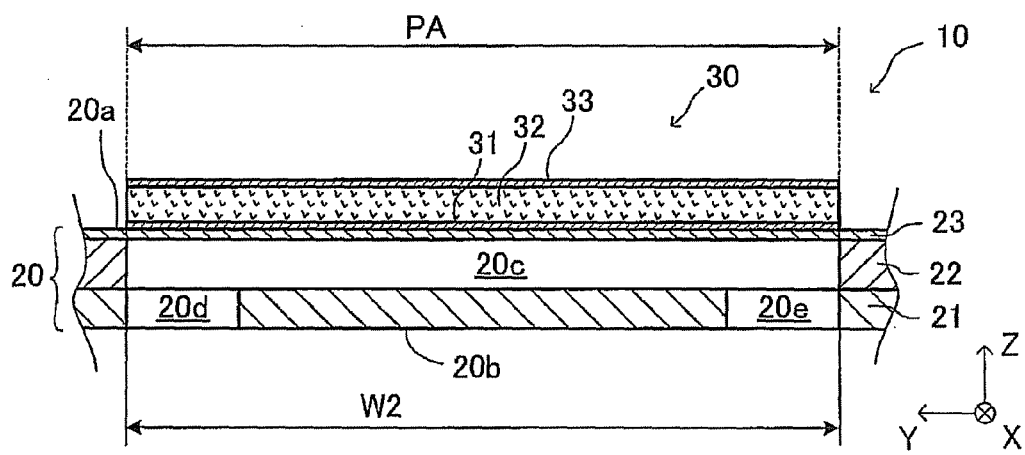
FIG. 3 is a cross sectional view of the piezoelectric membrane type device shown in FIG. 1, cut by a plane along line 2-2 of FIG. 1.

FIGS. 1 to 3 show schematic views of a piezoelectric membrane type device 10 manufactured by a first embodiment of a manufacturing method according to the present invention. The piezoelectric membrane type device 10 is, for example, an ink jet actuator used for a head of a printer and the like. The piezoelectric membrane type device 10 can be used for the other purposes. The piezoelectric membrane type device 10 comprises a single substrate 20, a plurality of piezoelectric devices (elements) 30. It should be noted that the manufacturing methods according to each of the embodiments of the present invention may also be used to manufacture a piezoelectric membrane type device 10 comprising a single substrate and a single piezoelectric device.

<<Substrate>>

The substrate 20 is a thin plate which has a rectangular parallelepiped shape having sides, each being parallel to one of X, Y, and Z axes perpendicularly intersecting one another. The substrate 20 comprises a first principal surface 20a parallel to an X-Y plane, and a second principal surface 20b parallel to the X-Y plane. That is, the first principal surface 20a and the second principal surface 20b are parallel to and opposed to each other.

The substrate 20 comprises a plurality of hollow portions (cavities, hollow rooms) 20c. A shape of the hollow portion 20c is a shape (a rectangular parallelepiped, a rectangular prismoid, and the like) including sides, each being parallel to one of X and Y axes. Accordingly, a shape of the hollow portion 20c when viewed in plan (a shape of the hollow portion 20c when viewed in a direction parallel to the Z-axis) is rectangular. There is not a limit on the shape of the hollow portion 20c, as long as a size of an end shape of the hollow portion 20c closer to the second principal surface 20b is equal to or smaller than a size of an end shape of the hollow portion 20c closer to the first principal surface 20a, when it is considered that a latent image of the hollow portion 20c is transcribed (transferred) onto a photosensitive film disposed above the substrate 20, as described later.

It should be noted that a positive direction of the Z-axis is defined as "an upper direction" for convenience, and a negative direction of the Z-axis is defined as "a lower direction" for convenience, in the present specification etc. Further, in the present specification etc., "a planar shape" of or "a shape when viewed in plan" of "a certain member or a certain hollow portion (space)" means a shape obtained when the certain member or the certain hollow portion is viewed along the direction parallel to the Z-axis (a direction perpendicular to the first principal surface 20a of the substrate 20) from the positive position of the Z-axis to the negative position of the Z-axis (i.e., when viewed from the upper position of the substrate 20 to the lower position of the substrate 20). Furthermore, the direction orthogonal to (perpendicular to) the first principal surface 20a of the substrate 20 is referred to as "a first principal surface orthogonal direction".

A plurality of the hollow portions 20c substantially have the same shape and the same size as each other. A length (width W1) along a non-longitudinal (shorter) direction of the hollow portion 20c is preferably, for example, longer than or equal to 30 μm and shorter than or equal to 200 μm. A length (width W2) along a longitudinal (longer) direction of the hollow portion 20c is preferably, for example, longer than or equal to 0.5 mm and shorter than or equal to 3 mm. A height (H1) of the hollow portion 20c is preferably, for example, longer than or equal to 10 μm and shorter than or equal to 300 μm.

It should be noted that the shape of the hollow portion 20c is not limited to the rectangular parallelepiped. That is, the shape of the hollow portion 20c when viewed in plan may be a polygonal shape other than the rectangular shape, a circular shape, an elliptical shape, a shape whose contour partially or entirely includes a curve, and so on. Further, it should be noted that a plurality of the hollow portions 20c in the present example have the same shape as each other, however, a plurality of the hollow portions 20c may have shapes different from each other.

As shown in FIG. 2, a plurality of the hollow portions 20c are arranged with a predetermined distance (interval) L1 in the X-axis direction therebetween. The distance L1 may be referred to as a space between hollow portions (a space between cavities) L1. The distance L1 may preferably be longer than or equal to 1 μm and shorter than or equal to 50 μm, and more preferably be longer than or equal to 3 μm and shorter than or equal to 20 μm. It should be noted that a plurality of the spaces between hollow portions L1 may be the same as each other, or may be different from each other.

Each of sides of the Y-axis negative direction ends of a plurality of the hollow portions 20c is on a single straight line parallel to the X-axis. Each of sides of the Y-axis positive direction ends of a plurality of the hollow portions 20c is therefore on a single straight line parallel to the X-axis. Each of upper walls (planes at the Z-axis positive direction end, the planes being parallel to the X-Y plane) of a plurality of the hollow portions 20c is in (or on) a single plane parallel to the X-Y plane. Each of lower walls (planes at the Z-axis negative direction end, the planes being parallel to the X-Y plane) of a plurality of the hollow portions 20c is therefore in (or on) a single plane parallel to the X-Y plane. That is, the substrate 20 is a substrate in which a plurality of the hollow portions 20c are arranged (disposed) with the interval of the predetermined distance L1 therebetween in a direction along the first principal surface 20a. It should be noted that a plurality of the hollow portions 20c may be arranged to form a lattice-pattern, or may be randomly arranged.

A pair of communicating passages 20d, 20e is connected to the hollow portion 20c. Each of the communicating passages 20d, 20e communicates the hollow portion 20c with an outside of the substrate 20. Each of the communicating passages 20d, 20e has a cylindrical shape having an axis extending along the Z-axis direction. One of ends of the communicating passage 20d opens on the lower wall of the hollow portion 20c at a position near the Y-axis positive direction end of the hollow portion 20c. The other end of the communicating passage 20d opens on the second principal surface 20b of the substrate 20. One of ends of the communicating passage 20e opens on the lower wall of the hollow portion 20c at a position near the Y-axis negative direction end of the hollow portion 20c. The other end of the communicating passage 20e opens on the second principal surface 20b of the substrate 20. It should be noted that the shape of the communicating passage (through hole) may be a shape (e.g., a rectangular parallelepiped shape) other than the cylindrical shape. Further, either one of the communicating passages 20d, 20e may be a passage having one end which forms an opening on "a wall surface parallel to an X-Z plane, the wall being a side wall constituting the hollow portion 20c", the passage extending in the Y-axis direction to communicate the hollow portion 20c with the outside of the substrate 20. Further, such a communicating passage extending along the axis may be a passage having the other end which forms an opening "on either one of the first principal surface 20a and the second principal surface 20b at a position which does not overlap with the hollow portion 20c when viewed in plan (when the substrate is viewed along the Z-axis)".

More specifically, the substrate 20 comprises a lower plate (a first base plate) 21, a middle plate (a second base plate) 22, and a vibration plate 23. The lower plate 21, the middle plate 22, and the vibration plate 23 are made of insulating ceramics. The lower plate 21, the middle plate 22, and the vibration plate 23 are layered (or laminated) in this order and united by being fired. That is, the substrate 20 is a fired ceramic body.

There is not a limit on the insulating ceramics which is a material of the lower plate 21, the middle plate 22, and the vibration plate 23, but the insulating ceramic may composed of, for example, a material including at least one material selecting from a group of zirconium oxide, aluminum oxide, magnesium oxide, mullite, aluminum nitride, and silicon nitride. Especially, stabilized zirconium oxide and partially-stabilized zirconium oxide may preferably be used as the material for the substrate 20 in terms of mechanical strength and toughness.

The lower plate 21 is a thin plate having a substantially uniform thickness. A plurality of through holes are formed so as to be arranged (disposed) at predetermined positions to constitute the above described communicating passages 20d, 20e. An upper surface of the lower plate 21 constitutes a plane of the lower wall of the hollow portion 20c.

The middle plate 22 is a thin plate having a substantially uniform thickness H1. A plurality of through holes are formed so as to be arranged (disposed) at predetermined positions. Side walls of the through holes constitute planes of the side walls of the hollow portions 20c.

The vibration plate 23 is a thin plate having a substantially uniform thickness. A thickness of the vibration plate 23 may preferably be, for example, smaller than or equal to 30 μm, and more preferably be larger than or equal to 1 μm and smaller than or equal to 15 μm. A lower surface of the vibration plate 23 constitutes a plane of the upper wall of the hollow portion 20c. The vibration plate 23 is formed so as to deform in accordance with expansion and contraction of the piezoelectric device 30. An upper surface of the vibration plate 23 constitutes the first principal surface 20a of the substrate 20.

A total thickness (i.e., a thickness of the substrate 20) of the lower plate 21, the middle plate 22, and the vibration plate 23 is determined in such a manner that "a light for exposure" described later can pass through the substrate 20 sufficiently. "The light for exposure" is a light which is directed or oriented from the second principal surface 20b to the first principal surface 20a, and is parallel to the first principal surface orthogonal direction (the Z-axis direction). Hereinafter, "the light for exposure" may be referred to as "irradiation light". Whether or not the irradiation light can pass through (penetrate) the substrate 20 sufficiently also depends on the material and the density of the substrate 20, and so on. For example, when the material of the substrate 20 is the partially-stabilized zirconium, a sum of thickness of the lower plate 21 and the middle plate 22 may preferably be greater than or equal to 20 μm and smaller than or equal to 300 μm. Accordingly, the thickness of the substrate 20 may preferably be greater than or equal to 21 μm and smaller than or equal to 330 μm.

<<Piezoelectric Device>>

The piezoelectric device 30 comprises a first electrode (a lower electrode film, a lower electrode layer) 31, a piezoelectric membrane 32, and a second electrode (an upper electrode film, an upper electrode layer) 32.

The first electrode 31 is a fired body (sintered body) of a conductive material. For example, the first electrode 31 is made of a metal such as platinum, palladium, rhodium, gold, and silver, or an alloy which includes one or more of those metals as a major component. The first electrode 31 may be formed of the other conductive materials.

It is preferable that a thickness of the first electrode 31 after sintering be roughly between 0.3 μm and 5.0 μm, for example. It is necessary that the thickness and the material of the first electrode 31 should be determined so as not to allow "the irradiation light" to pass through the first electrode 31, together with the thickness and the material of the vibration plate 23.

As shown in FIGS. 2 and 3, "an image obtained by projecting the hollow portion 20c" in the first principal surface orthogonal direction onto the first principal surface 20a of the substrate 20 is hereinafter referred to as "a hollow portion projected image". Further, "a space region PA obtained by extending the hollow portion projected image in the first principal surface orthogonal direction" is referred to as "a hollow portion projected region PA". Accordingly, the hollow portion projected region PA when viewed in plan coincides with the hollow portion 20c when viewed in plan. That is, in a plan view, an outline (or a circumference) of the hollow portion projected region PA coincides with "an outline (or a circumference) of the hollow portion 20c" and "an outline (or a circumference) of the hollow portion projected image".

The first electrode 31 is disposed (or formed) on (on an upper surface of) the first principal surface 20a of the substrate 20. Further, the first electrode 31 is formed so as to exist at (or within) the hollow portion projected region PA. In other words, the first electrode 31 is provided in such a manner that "a position and a shape of the first electrode 31 when viewed in plan coincide with the position and the shape of the hollow portion 20c when viewed in plan, respectively". The first electrode 31 is united (or integrated) with the vibration plate 23. A lower wiring electrode (not shown) is connected to the first electrode 31. The lower wiring electrode is connected to a drive circuit (not shown) so as to constitute a power feeding path for the first electrode 31.

The piezoelectric membrane 32 is a fired body of the piezoelectric ceramics. There is not a limit on a material of the piezoelectric membrane 32, however, in terms of electric field induced strain, it is preferable that the piezoelectric membrane 32 be made of lead(Pb)-based perovskite oxide, or non-lead-based perovskite oxide. It is more preferable that lead(Pb)-based perovskite oxide be made of lead zirconium titanate (PZT; $Pb(Zr_xTi_{1-x})O_3$, or "denatured lead zirconium titanate to which simple oxide and/or complex perovskite oxide is added".

Specifically, one of materials described below may be used as the material of the piezoelectric membrane 32.

lead zirconate titanate (PZT; $Pb(Zr_xTi_{1-x})O_3$;

a solid solution of lead zirconate titanate and lead magnesium niobate ($Pb(Mg_{1/3}Nb_{2/3})O_3$) to which nickel oxide (NiO) is added; and a solid solution of lead zirconate titanate and lead nickel niobate ($Pb(Ni_{1/3}Nb_{2/3})O_3$).

As non-lead-based perovskite oxide, $(Na, Nb)TiO_3$, $(K, Nb)TiO_3$, $(Bi, Na)TiO_3$, $BaTiO_3$, and $SrTiO_3$.

A thickness of the piezoelectric membrane 32 after firing may preferably be, for example, greater than or equal to 1 μm and smaller than or equal to 15 μm, and more preferably greater than or equal to 1 μm and smaller than or equal to 5 μm. A polarization treatment for the piezoelectric membrane 32 has been performed.

The piezoelectric membrane 32 is disposed (or formed) on (on an upper surface of) the first electrode 31. Further, the piezoelectric membrane 32 is formed so as to exist at (or within) the hollow portion projected region PA. In other words, the piezoelectric membrane 32 is provided in such a manner that "a position and a shape of the piezoelectric membrane 32 when viewed in plan coincide with the position and the shape of the hollow portion 20c when viewed in plan, respectively". The piezoelectric membrane 32 is united (or integrated) with the first electrode 31. Accordingly, a distance (interval) between the piezoelectric membranes 32 adjacent to each other (space between piezoelectric membranes) is substantially the same as the space L1 between hollow portions. It is therefore preferable that the space between piezoelectric membranes be longer than or equal to 1 μm and shorter than or equal to 50 μm, and more preferably be longer than or equal to 3 μm and shorter than or equal to 20 μm.

The second electrode 33 is a fired metallic body (sintered body) made of a material similar to the material of the first electrode 31. It is preferable that a thickness of the second electrode 33 after sintering be roughly between 0.06 μm and 3.0 μm, for example.

The second electrode 33 is disposed (or formed) on (on an upper surface of) the piezoelectric membrane 32. Further, the second electrode 33 is formed so as to exist at (or within) the hollow portion projected region PA. In other words, the second electrode 33 is provided in such a manner that "a position and a shape of the second electrode 33 when viewed in plan coincide with the position and the shape of the hollow portion 20c when viewed in plan, respectively". The second electrode 33 is united (or integrated) with the piezoelectric membranes 32. Accordingly, the piezoelectric device 30 is united (or integrated) with the vibration plate 23 (and therefore with the substrate 20). An upper wiring electrode (not shown) is connected to the second electrode 33. The upper wiring electrode is connected to the drive circuit (not shown) so as to constitute a power feeding path for the second electrode 33.

In the piezoelectric membrane type device 10 configured as described above, an altering electric field is applied to the piezoelectric membrane 32, when an altering electric potential difference is applied between the first electrode 31 and the second electrode 33 (that is, when an altering voltage is provided to the piezoelectric membrane 32). As a result, the piezoelectric membrane 32 extends and contracts in the direction parallel to the first principal surface 20a, and thereby the vibration plate 23 integrated with the piezoelectric device 30 performs flexion movement. This flexion movement of the vibration plate 23 causes a change in a volume of the hollow portion 20c. Accordingly, if the hollow portion 20 is filled with ink, the ink is injected to outside of the piezoelectric membrane type device 10 through the communicating passage 20d. Notably, the ink is introduced into the hollow portion 20c through the communicating passage 20e.

<First Manufacturing Method>

"A method for manufacturing the piezoelectric membrane type device (hereinafter, referred to as "a first manufacturing method")" according to a first embodiment of the present invention will next be described.

1. First (1st) Step (Substrate Preparing Step)

Figure 4:
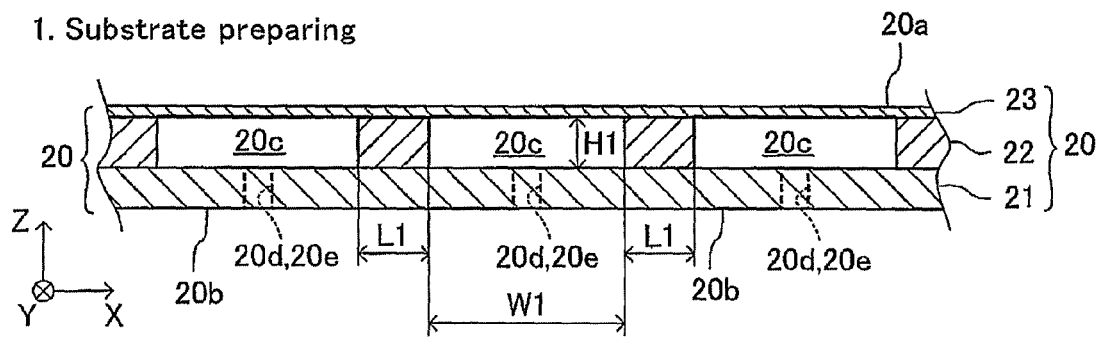
FIG. 4 is a figure to describe a first step of the first manufacturing method.

First, the substrate 20 shown in FIG. 4 is formed (prepared). For example, the substrate 20 is made as follows.

A ceramic green sheet which will become the lower plate 21 is prepared, and through holes which will become the communicating passages 20d, 20e are formed in the ceramic green sheet at positions corresponding to the communicating passages 20d, 20e.

A ceramic green sheet which will become the middle plate 22 is prepared, and through holes which will become the hollow portions 20c are formed in the ceramic green sheet at positions corresponding to the hollow portions 20c.

A ceramic green sheet which will become the vibration plate 23 is prepared.

The ceramic green sheet which will become the middle plate 22 is layered (laminated, placed) on the ceramic green sheet which will become the lower plate 21, and further, the ceramic green sheet which will become the vibration plate 23 is layered (laminated, placed) on the ceramic green sheet which will become the middle plate 22. At this time, position adjustment in a planar direction of the plates is performed.

The layered (laminated) ceramic green sheets are thermal compression bonded.

The thermal compression bonded ceramic green sheets (the layered body) is degreased, and thereafter fired.

2. Second (2nd) Step (Third Photosensitive Film Forming Step)

Figure 5:
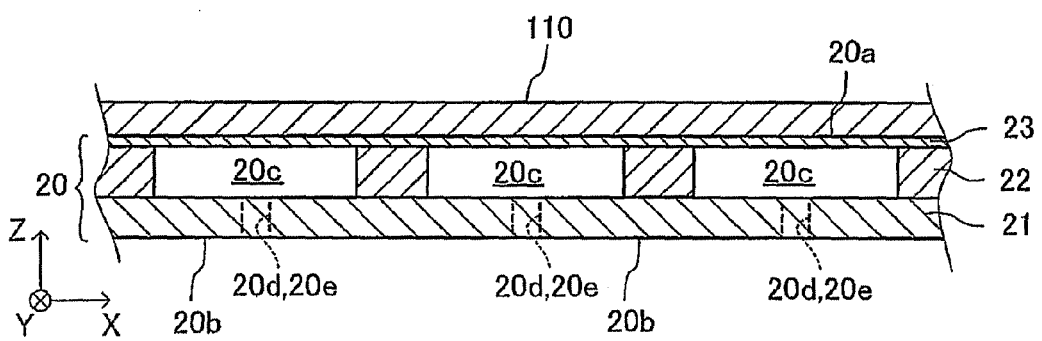
FIG. 5 is a figure to describe a second step of the first manufacturing method.

Next, as shown in FIG. 5, a photoresist film 110 is formed on the first principal surface 20a of the substrate 20. The photoresist film 110 is referred to as "a third photosensitive film 110" for convenience. The third photosensitive film 110 is formed so as to cover an entire area of the first principal surface 20a. The third photosensitive film 110 is formed (applied) by, for example, spin coating, slit coating, roll coating, spraying, screen printing, and so on. Further, the third photosensitive film 110 may be formed by applying a photosensitive dry film resist.

A thickness of the third photosensitive film 110 is sufficiently large, as compared with a thickness of the first electrode 31. The third photosensitive film 110 is a "negative (negative type)" photoresist film whose dissolution ability in a developer (an organic solvent) becomes lower after it is exposed. Examples of a material of the third photosensitive film 110 include, but are not limited to, a photosensitive resin, such as acrylic, epoxy, polyimide, or fluorine photosensitive resin. Further, the material of the third photosensitive film 110 may be a chemical-resistant protective material. It is more preferable that the third photosensitive film 110 be a chemically-amplified photoresist film, in terms of a resolution for pattern formation.

3. Third (3rd) Step (Opaque Material (Third Light Shielding Material) Filling Step)

Figure 6:
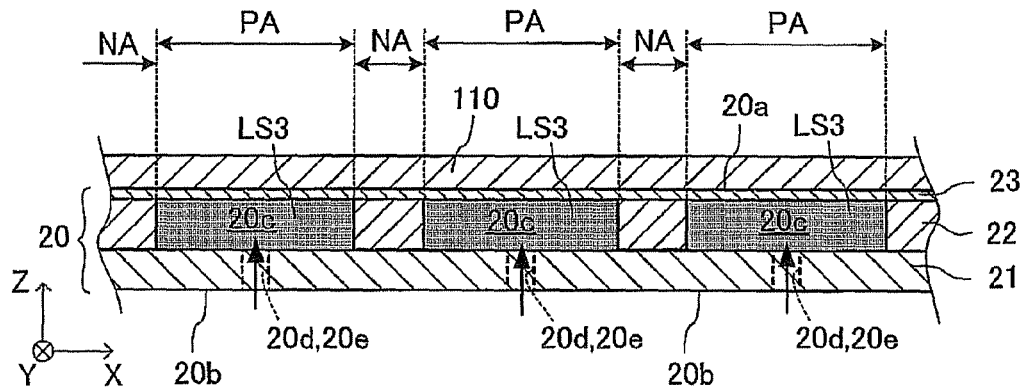
FIG. 6 is a figure to describe a third step of the first manufacturing method.

Subsequently, as shown in FIG. 6, a fluidic (fluid-like) material (or liquid material, third light shielding material LS3) containing a light shielding material (opaque material) is introduced (filled) into the hollow portion 20c of the substrate 20. For example, the third light shielding material LS3 may be either "a light shielding liquid including a solvent and a solid light shielding material dissolved in the solvent" or "a light shielding liquid including a disperse media and a solid light shielding material dispersed in the disperse media". It is preferable that the light shielding material include a dye (dyes) or a pigment (pigments), each absorbing a light. Further, the light shielding material may be a material having a refraction index different from a refraction index of the substrate 20. In this case, "the irradiation light" is totally reflected in the hollow portion 20c, and therefore, the irradiation light can not pass through the hollow portion 20c.

The light shielding liquid is filled into the hollow portion 20c by being introduced with an injector (or a syringe) and the like through the communicating passage 20d and/or the communicating passage 20e. Thereafter, the substrate 20 is heated with a hot plate, an oven, or the like, to thereby cause "the solvent or the disperse media" for the third light shielding material LS3 to disappear (eliminate "the solvent or the disperse media"). As a result, a hardened light shielding material (light shield) is formed in the hollow portion 20c. It should be noted that "solid or semisolid material" containing "the light shielding material" may be filled into the hollow portion 20c. Further, it is not necessary to harden the fluidic material containing the light shielding material, if the fluidic material can be held (or maintained) in the hollow portion 20c under a non-hardened state.

4. Fourth (4th) Step (Third Photosensitive Film Exposure Step, Third Exposure Step)

Figure 7:
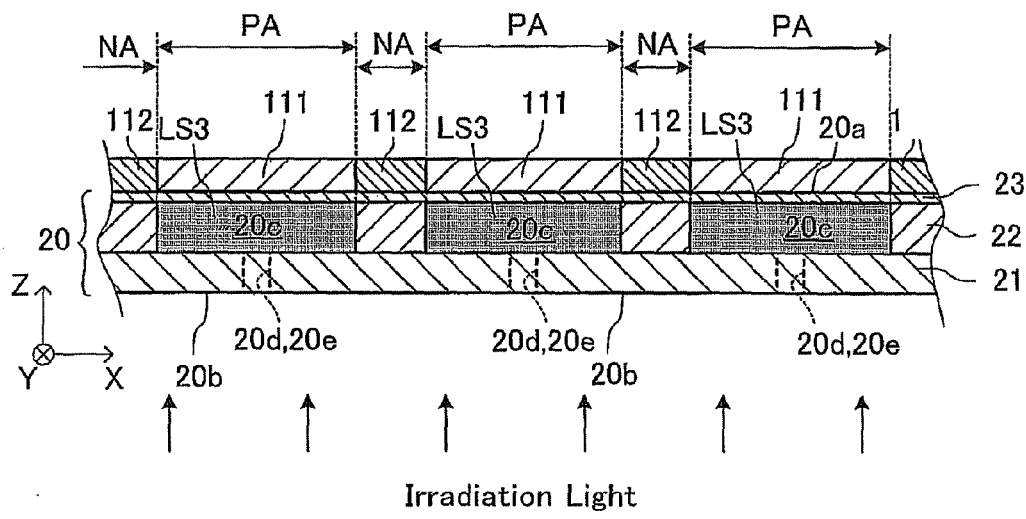
FIG. 7 is a figure to describe a fourth step of the first manufacturing method.

Subsequently, as shown in FIG. 7, "a light which is directed to the first principal surface 20a and is parallel to the first principal surface orthogonal direction (light along the Z-axis positive direction)" is irradiated onto the substrate 20 from a side of the second principal surface 20b of the substrate 20. The irradiated light can pass through a portion where the hollow portions 20c are not formed within the substrate 20, however, can not pass through the hollow portions 20c which are filled with the third light shielding material LS3. Accordingly, (a portion of) the third photosensitive film 110 existing at (within) the hollow portion projected region PA is not exposed, and only (a portion of) the third photosensitive film 110 existing at (within) a region NA other than the hollow portion projected region PA (the region NA being a region outside of the hollow portion projected region PA) is exposed. The exposed portion within the third photosensitive film 110 is also referred to as an exposed third photosensitive film 112. Consequently, "a position and a shape" of the portion 111 of the third photosensitive film 110 which is not exposed, when viewed in plan, coincide with the position and the shape of the hollow portion 20c when viewed in plan, respectively, with extremely high accuracy. The portion 111 which has not been exposed of the third photosensitive film 110 is also referred to as a non-exposed portion of the third photosensitive film 111. In addition, this step is referred to as "a third photosensitive film exposure step" or "a third exposure step", for convenience.

5. Fifth (5th) Step (Non-Exposed Portion of the Third Photosensitive Film Eliminating Step: Completion of a Third Mask)

Figure 8:
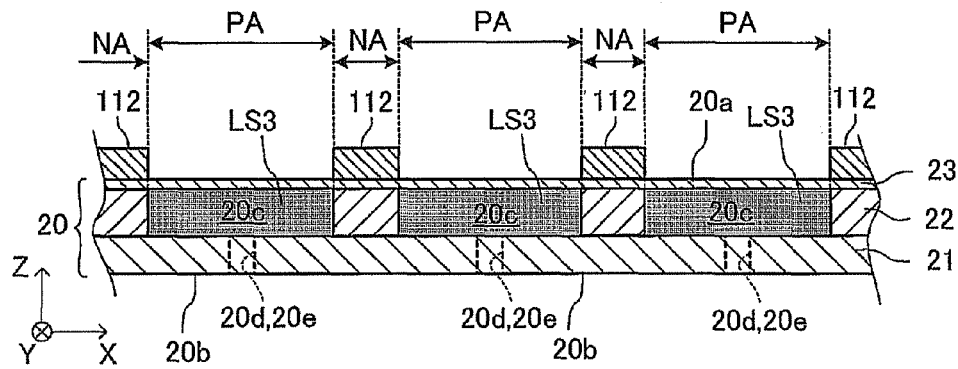
FIG. 8 is a figure to describe a fifth step of the first manufacturing method.

Subsequently, "the portion 111 which has not been exposed of the third photosensitive film 110" is eliminated with (using) the developer (an alkaline aqueous solution or an organic solvent). As a result, as shown in FIG. 8, only the third photosensitive film 112 (the exposed third photosensitive film 112) existing at (in) the region NA other than the hollow portion projected region PA remains (or is left), and the remained exposed third photosensitive film 112 becomes a third mask 112. Accordingly, a position and a shape of a portion at which the third mask 112 does not exist when viewed in plan coincide with the position and the shape of the hollow portion 20c when viewed in plan, respectively, with extremely high accuracy. Thereafter, the third mask 112 may be heated by heating the entire substrate 20 with a hot plate to thereby further harden the third mask 112.

6. Sixth (6th) Step (Light Shielding Material (Third Light Shielding Material) Eliminating Step)

Figure 9:
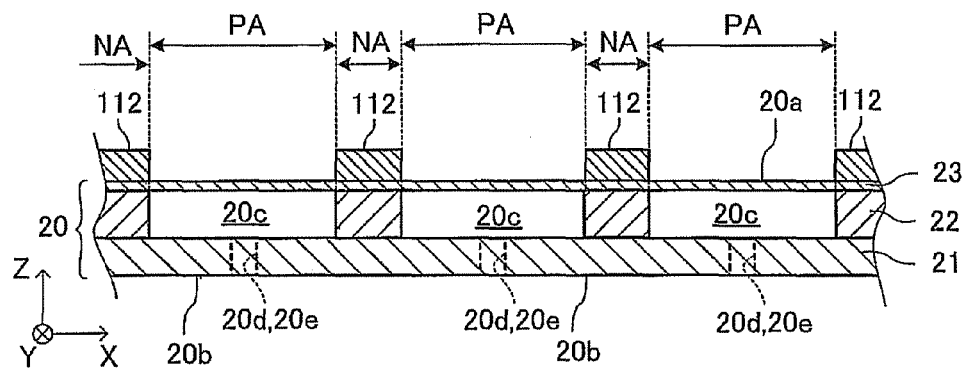
FIG. 9 is a figure to describe a sixth step of the first manufacturing method.

Subsequently, a solvent is introduced into the hollow portion 20c to eliminate the third light shielding material LS3 from the hollow portion 20c (refer to FIG. 9). This step is also referred to as a material for exposure of the third photosensitive film eliminating step. Further, a group of the steps from the second step to sixth (or to fifth) step may be referred to as a third mask forming step.

7. Seventh (7th) Step (Conductive Material Film Forming Step)

Figure 10:
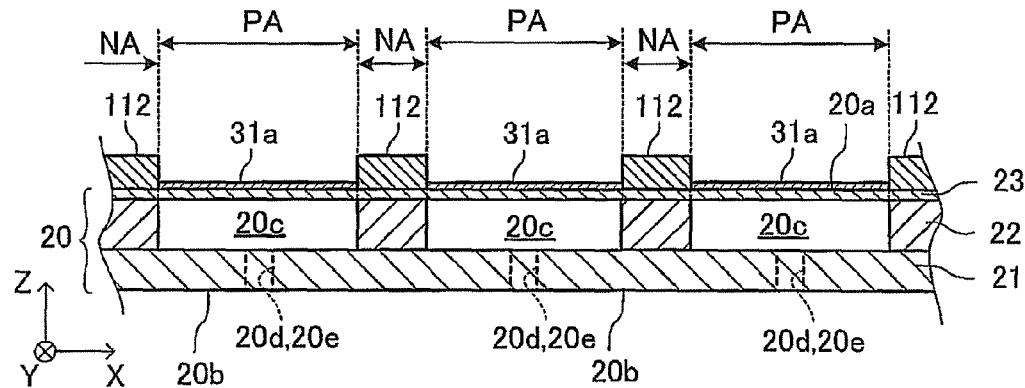
FIG. 10 is a figure to describe a seventh step of the first manufacturing method.

Subsequently, as shown in FIG. 10, "conductive material films 31a (conductive films 31a for the first electrodes) which will become the first electrodes 31" are formed at the portions where the third masks 112 do not exist. The conductive films 31a for the first electrodes may also be formed on upper surfaces of the third masks 112, because the third masks 112 will be eliminated later.

The conductive film 31a for the first electrode may be formed using one of following methods of (1) to (3), for example.

(1) A paste including a conductive material dispersed in disperse media (hereinafter referred to as "a conductive paste") is applied using a screen printing method etc. Thereafter, the disperse media included in the applied conductive paste is eliminated by evaporating the disperse media.

(2) A solution in which a conductive resinate is dissolved in a solvent (hereinafter referred to as "a conductive resinate") is applied using a spin coating method, a spray method, or the like. Thereafter, the solvent included in the applied conductive resinate is eliminated by evaporating the solvent.

(3) A conductive material is evaporated (deposited) onto the upper surface of the first principal surface 20a using a sputtering deposition method, a resistive heating evaporation method, or the like.

(4) A conductive material is plated to be a film on the upper surface of the first principal surface 20a using a nonelectrolytic plating method.

8. Eighth (8th) Step (Third Mask Eliminating Step)

Figure 11:
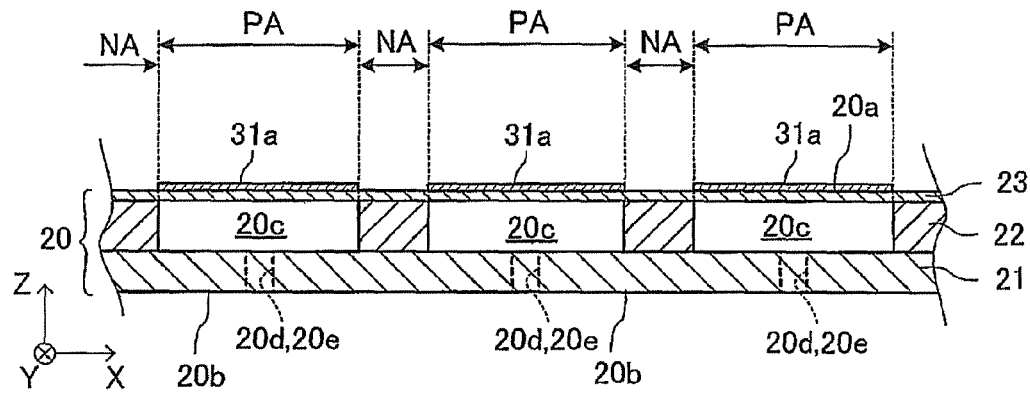
FIG. 11 is a figure to describe an eighth step of the first manufacturing method.

Subsequently, the third masks 112 are eliminated by removing the third masks 112. The elimination (removal) of the third masks 112 is performed using a chemical removal method, a heat treatment method, a plasma treatment method, or the like, for example. As a result, as shown in FIG. 11, the conductive films 31a for the first electrodes are formed on the upper surface of the first principal surface 20a only within the hollow portion projected region PA. As described above, the position and the shape of the portion where the third mask 112 does not exist when viewed in plan coincide respectively with the position and the shape of the hollow portion 20c when viewed in plan with extremely high accuracy. Accordingly, a position and a shape of the conductive film 31a for the first electrode when viewed in plan coincide with the position and the shape of the hollow portion 20c when viewed in plan, respectively, with extremely high accuracy. Thereafter, the conductive films 31a for the first electrodes are fired (sintered) so as to form the first electrodes 31.

9. Ninth (9th) Step (Second Photosensitive Film Forming Step)

Figure 12:
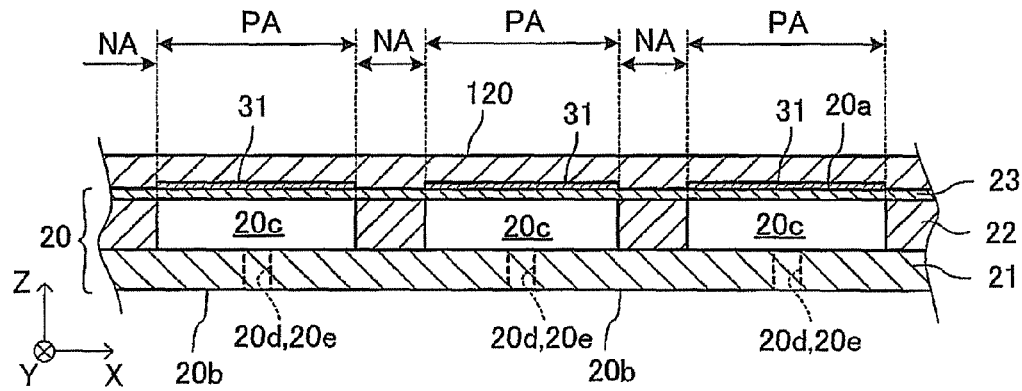
FIG. 12 is a figure to describe a ninth step of the first manufacturing method.

Subsequently, as shown in FIG. 12, a photoresist film 120 is formed above the first principal surface 20a of the substrate 20. The photoresist film 120 is referred to as "a second photosensitive film 120" for convenience. That is, in this step, the second photosensitive film 120 is formed in the form of film, on the exposed portions of the principal surface 20a and on the first electrodes 31. The second photosensitive film 120 is formed (applied) by, for example, spin coating, slit coating, roll coating, spraying, screen printing, and so on. Further, the second photosensitive film 120 may be formed by applying a photosensitive dry film resist.

The second photosensitive film 120, similarly to the third photosensitive film 110, is a "negative (negative type) photoresist film" whose dissolution ability in a developer (an alkaline aqueous solution or an organic solvent) becomes lower after it is exposed. Examples of a material of the second photosensitive film 120 include, but are not limited to, "a photosensitive resin or a photosensitive chemical-resistant protective material", that is acrylic, epoxy, polyimide, or fluorine etc. It is preferable that the second photosensitive film 120 be a chemically-amplified photoresist film, in terms of a resolution for pattern formation.

10. Tenth (10th) Step (Second Photosensitive Film Exposure Step, Second Exposure Step)

Figure 13:
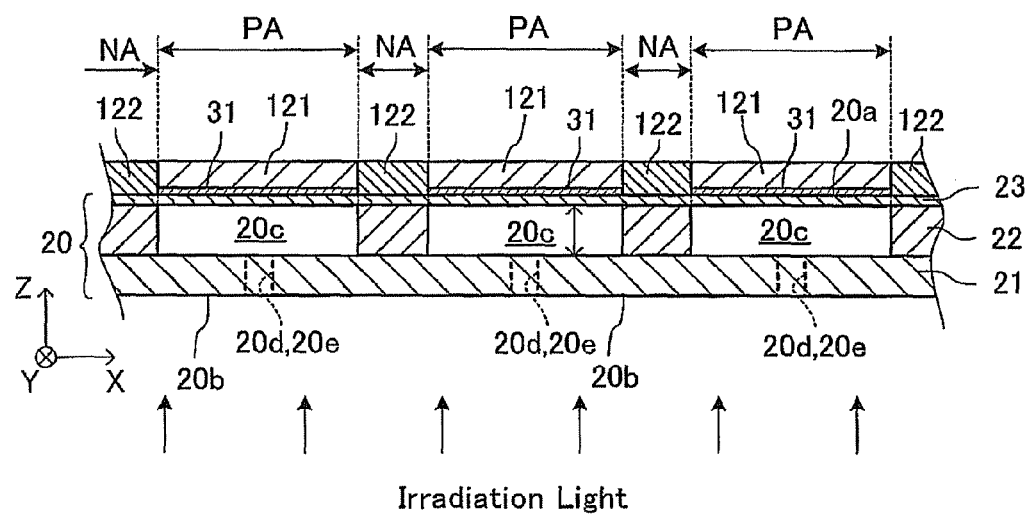
FIG. 13 is a figure to describe a tenth step of the first manufacturing method.

Subsequently, as shown in FIG. 13, "a light which is directed to the first principal surface 20a and is parallel to the first principal surface orthogonal direction (light along the Z-axis positive direction)" is irradiated to the substrate 20 from the side of the second principal surface 20b of the substrate 20. The irradiated light (the irradiation light) can pass through the portion where the hollow portions 20c are not formed within the substrate 20, however, can not pass through a portion where the first electrodes 31 are formed.

As described above, the position and the shape of the first electrode 31 when viewed in plan coincide with the position and the shape of the hollow portion 20c when viewed in plan, respectively, with extremely high accuracy. Accordingly, (a portion of) the second photosensitive film 120 existing at (within) the hollow portion projected region PA is not exposed, and only (a portion of) the third photosensitive film 120 existing at (in) the region NA other than the hollow portion projected region PA is exposed. The exposed portion within the second photosensitive film 120 is also referred to as an exposed second photosensitive film 122. Consequently, "a position and a shape" of a portion 121 which is not exposed of the second photosensitive film 120 when viewed in plan coincide with the position and the shape of the hollow portion 20c when viewed in plan, respectively, with extremely high accuracy. The portion 121 which is not exposed of the second photosensitive film 121 is also referred to as a non-exposed portion 121 of the second photosensitive film. In addition, this step is referred to as "a second photosensitive film exposure step" or "a second exposure step", for convenience.

11. Eleventh (11th) Step (Non-Exposed Portion of the Second Photosensitive Film Eliminating Step: Completion of a Second Mask)

Figure 14:
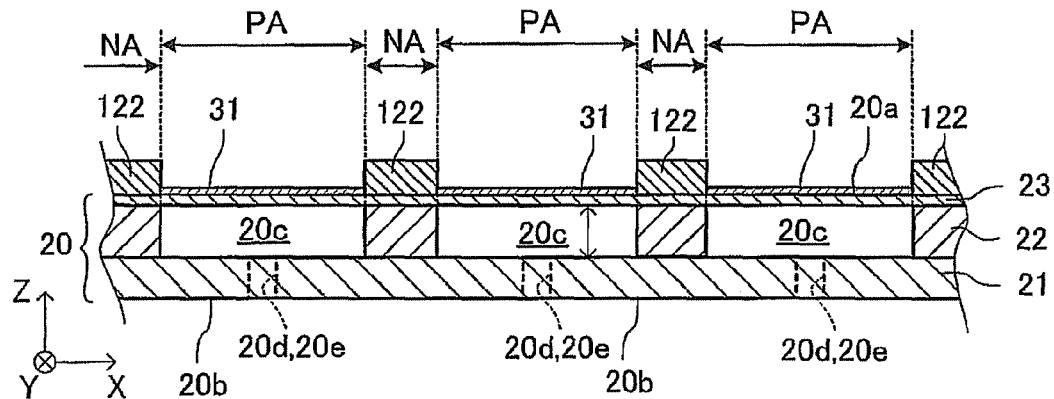
FIG. 14 is a figure to describe an eleventh step of the first manufacturing method.

Subsequently, "the portion 121 which has not been exposed of the second photosensitive film 120" is eliminated with (using) the developer (the alkaline aqueous solution or the organic solvent). As a result, as shown in FIG. 14, only the second photosensitive film 122 existing at (in) the region NA other than the hollow portion projected region PA (the exposed second photosensitive film 122) remains (or is left), and the remained exposed second photosensitive film 122 becomes a second mask 122. Accordingly, a position and a shape of a portion at which the second mask 122 does not exist when viewed in plan coincides with the position and the shape of the hollow portion 20c when viewed in plan, respectively, with extremely high accuracy. Thereafter, the second masks 122 may be heated by heating the entire substrate 20 with a hot plate to thereby further harden the second masks 122. It should be noted that a thickness of the second mask 122 is determined with considering (based on) a thickness of a first mask 131 described later (refer to FIG. 18) as well as a process selectivity in a piezoelectric material layer processing step described later (blast processing, refer to FIG. 20). The thickness of the second mask 122 is preferably larger than or equal to 2 μm and smaller than or equal to 10 μm, and more preferably larger than or equal to 3 μm and smaller than or equal to 5 μm.

12. Twelfth (12th) Step (Piezoelectric Material Layer Forming Step)

Figure 15:
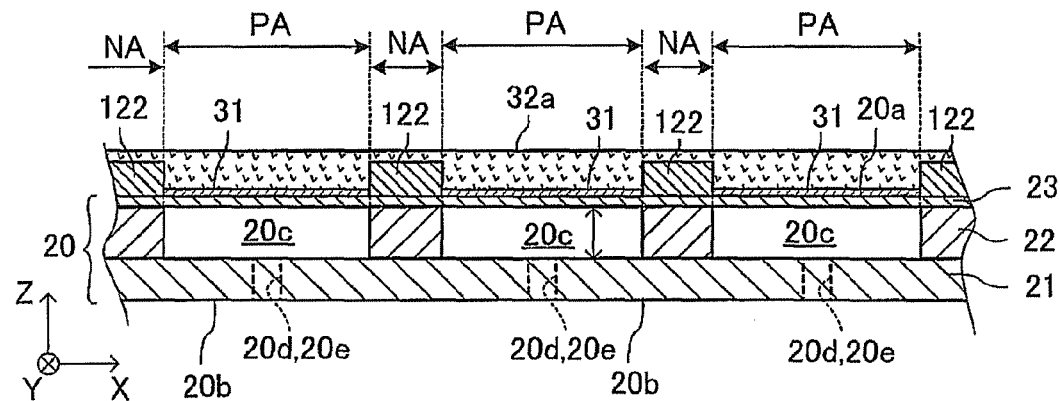
FIG. 15 is a figure to describe a twelfth step of the first manufacturing method.

Subsequently, as shown in FIG. 15, a piezoelectric material layer 32a is formed above the first principal surface 20a. More specifically, a piezoelectric ceramic paste is applied on upper surfaces of "the first electrodes 31 and the second masks 122" so as to form the piezoelectric material layer 32a. There is not a limit on a method of applying the piezoelectric ceramic paste, however, for example, a wet applying method, such as spin coating, slit coating, roll coating, sol-gel method, spraying, and screen printing, or an electrophoresis method using the lower electrode pattern as an electrode may preferably be used. It should be noted that the piezoelectric material layer 32a may be formed using ion-beam, sputtering, vacuum deposition, PVD, ion plating, CVD, or the like, in place of applying the ceramic paste.

A solid fraction of the piezoelectric ceramic paste is preferably between 88 to 99 weight percent, and is more preferably between 90 to 96 weight percent in terms of a sintered density and workability (pattern workability). Further, examples of a resin which is a binder of the piezoelectric ceramic paste include, but are not limited to, one of a butyral resin, a cellulose resin, an acrylate resin, and a mixture of these resins, in terms of adsorption ability and dispersibility for the ceramic material.

12A. Twelfth A (12th-A) Step (Middle Layer for Reaction Prevention Forming Step)

Figure 16:
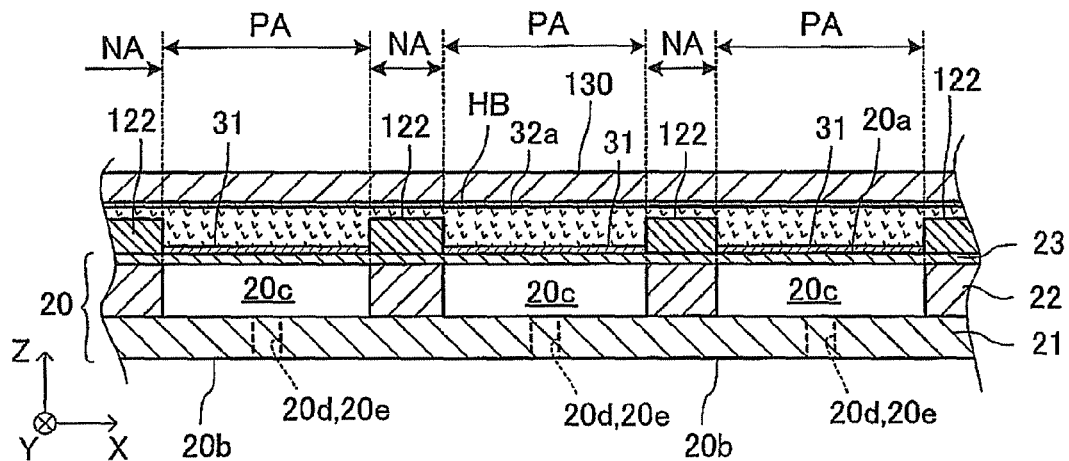
FIG. 16 is a figure to describe a thirteenth step of the first manufacturing method.

Subsequently, as shown in FIG. 16, a middle layer for reaction prevention HB is formed above (or on an upper surface of) the piezoelectric material layer 32a. The middle layer for reaction prevention HB is a film to prevent dissolution reaction between the piezoelectric material layer 32a and a first photosensitive film 130 which will be formed above the piezoelectric material layer 32a (refer to a first photosensitive film forming step described later). There is not a limit on a material of the middle layer for reaction prevention HB, as long as it is the material which can prevent the mutual dissolution reaction between the piezoelectric material layer 32a (the material of the piezoelectric membrane 32) and the first photosensitive film 130, and it neither dissolves in nor reacts with the piezoelectric material layer 32a. For example, as the material of the middle layer for reaction prevention HB, PVA (polyvinyl alcohol) which is a hydrophilic resin, PAc (polyacrylic acid), or the like may be preferably used. The middle layer for reaction prevention HB may be formed using spin coating, slit coating, roll coating, spraying, screen printing, and so on. A thickness of the middle layer for reaction prevention HB is preferably greater than or equal to 0.1 μm and smaller than or equal to 1 μm, and is more preferably equal to 0.5 μm. It should be noted that this middle layer for reaction prevention forming step may be carried out as may be necessary.

13. Thirteenth (13 th) Step (First Photosensitive Film Forming Step)

Subsequently, as shown in FIG. 16, a photoresist film 130 is formed above the piezoelectric material layer 32a (on the upper surface of the piezoelectric material layer 32a when the middle layer for reaction prevention HB is not provided, or on the upper surface of the middle layer for reaction prevention HB when the middle layer for reaction prevention HB is provided). The photosensitive film 130 is referred to as "a first photosensitive film 130" for convenience. The first photoresist film 130 is formed so as to cover an entire area of the piezoelectric material layer 32a. It is preferable that the first photosensitive film 130 be formed above the piezoelectric material layer 32a through attaching a photosensitive resin sheet, in terms of reactivity with the piezoelectric material layer 32a (piezoelectric ceramic paste). The first photosensitive film 130 is formed (applied) by, for example, spin coating, slit coating, roll coating, spraying, screen printing, and so on. Further, the first photosensitive film 130 may be formed by applying a photosensitive dry film resist.

The first photosensitive film 130 is a "positive (positive type)" photoresist film whose dissolution ability in the developer (the alkaline aqueous solution or the organic solvent) becomes higher after it is exposed. Examples of a material of the first photosensitive film 130 include, but are not limited to, "a photosensitive resin or a photosensitive chemical-resistant protective material", that is rubber-based, urethane, epoxy, polyimide, and fluorine etc.

14. Fourteenth (14th) Step (First Photosensitive Film Exposure Step, First Exposure Step)

Figure 17:
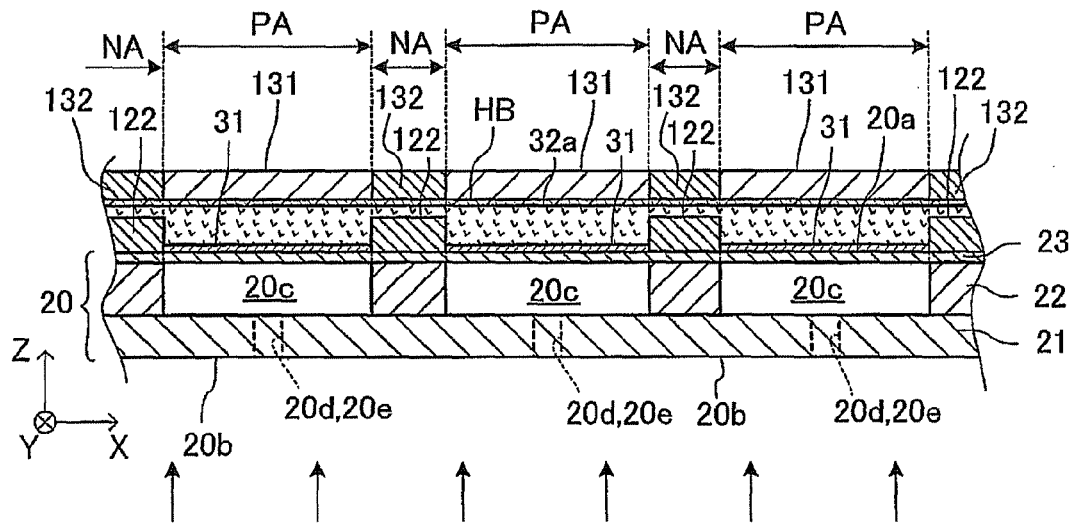
FIG. 17 is a figure to describe a fourteenth step of the first manufacturing method.

Subsequently, as shown in FIG. 17, "a light which is directed to the first principal surface 20a and is parallel to the first principal surface orthogonal direction (light along the Z-axis positive direction)" is irradiated from the side of the second principal surface 20b of the substrate 20. The irradiated light (the irradiation light) can pass through the portion where the hollow portions 20c are not formed within the substrate 20, however, can not pass through the portion where the first electrodes 31 are formed.

As described above, the position and the shape of the first electrode 31 when viewed in plan coincide with the position and the shape of the hollow portion 20c when viewed in plan, respectively, with extremely high accuracy. Accordingly, the first photosensitive film 130 existing at (within) the hollow portion projected region PA is not exposed, and only the first photosensitive film 130 existing at (within) the region NA other than the hollow portion projected region PA is exposed. The exposed portion within the first photosensitive film 130 is also referred to as an exposed first photosensitive film 132. Consequently, "a position and a shape" of the portion 131 which is not exposed of the first photosensitive film 130 when viewed in plan coincide with the position and the shape of the hollow portion 20c when viewed in plan, respectively, with extremely high accuracy. The portion 131 which is not exposed of the first photosensitive film 130 is also referred to as a non-exposed portion of the first photosensitive film 131. In addition, this step is referred to as "a first photosensitive film exposure step" or "a first exposure step", for convenience.

It should be noted that a light shield (light shielding body) may be formed in the hollow portions 20c prior to (before) the first exposure step (the fourteenth step), as described later. In this case, the first photosensitive film 130 existing at (within) the hollow portion projected region PA is not exposed due to the light shield, and only the first photosensitive film 130 existing at (within) the region NA other than the hollow portion projected region PA is exposed.

As is apparent from the above description, it can be said that the first exposure step (the 14th step) is an exposure step which utilizes the substrate 20 as a mask for the irradiation light. That is, the first exposure step (the 14th step) is a step of exposing the first photosensitive film 130 existing at (within) the region NA other than the hollow portion projected region PA without exposing the first photosensitive film 130 existing at (within) the hollow portion projected region PA, by irradiating the irradiation light.

15. Fifteenth (15 th) Step (Exposed Portion of the First Photosensitive Film Eliminating Step: Completion of Forming a First Mask)

Figure 18:
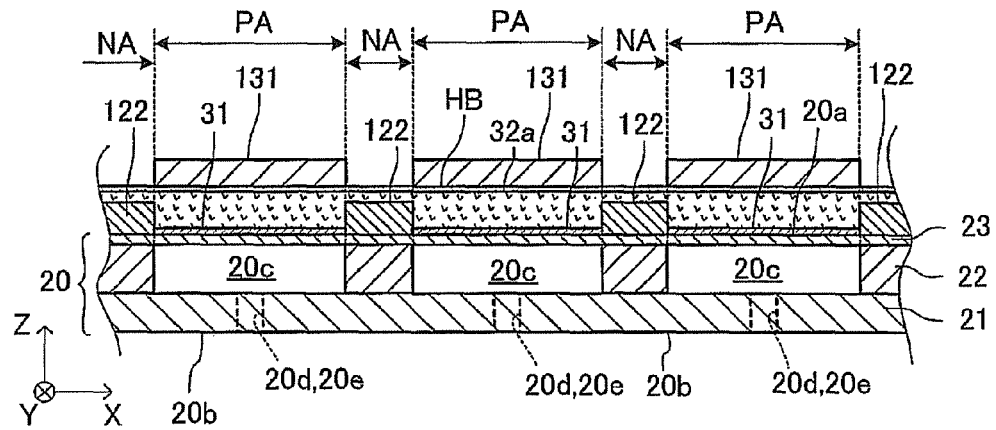
FIG. 18 is a figure to describe a fifteenth step of the first manufacturing method.

Subsequently, "the portion 132 which has been exposed of the first photosensitive film 130" is eliminated with (using) the developer (the alkaline aqueous solution or the organic solvent). As a result, as shown in FIG. 18, only the first photosensitive film 131 existing at (within) the hollow portion projected region PA remains (or is left), and the remained exposed first photosensitive film 131 becomes a first mask 131. Accordingly, a position and a shape of the first mask 131 when viewed in plan coincide with the position and the shape of the hollow portion 20c when viewed in plan, respectively, with extremely high accuracy. Thereafter, the first masks 131 may be heated by heating the entire substrate 20 with a hot plate to thereby further harden the first masks 131.

Subsequently, in a case in which the middle layer for reaction prevention HB has been formed, the middle layer for reaction prevention HB is eliminated with a hot water (liquid temperature 60° C.). Examples of a method to eliminate the middle layer are, but not limited to, a spray atomization, a dipping/shaking, a showering, and the like. Further, the middle layer for reaction prevention may be eliminated using a spraying method using an air brush. Furthermore, the middle layer for reaction prevention HB may be eliminated using a blast processing in a piezoelectric material layer processing step described later. The step for eliminating the middle layer for reaction prevention HB is referred to as a middle layer for reaction prevention eliminating step. The middle layer for reaction prevention eliminating step is a step of eliminating the middle layer for reaction prevention existing at (within) the region NA other than the hollow portion projected region PA without eliminating the middle layer for reaction prevention existing at (within) the hollow portion projected region PA.

16. Sixteenth (16th) Step (Support Forming Step)

Figure 19:
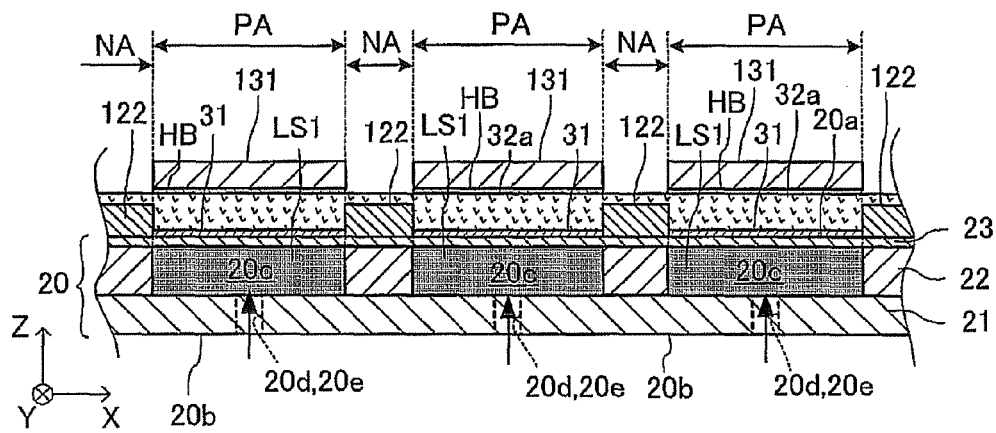
FIG. 19 is a figure to describe a sixteenth step of the first manufacturing method.

Subsequently, as shown in FIG. 19, a fluidic material LS1 is introduced (filled) into the hollow portions 20c of the substrate 20. After the fluidic material LS1 is introduced into the hollow portions 20c, the fluidic material LS1 is heated to thereby be dried and hardened. That is, the fluidic material LS1 changes into a support SJ having a relatively high mechanical strength (refer to FIG. 20). The fluidic material LS1 is composed of a material which can be eliminated from the hollow portion 20c by "heating, dissolving, and ashing, and so on", after it is dried and hardened. For example, as the fluidic material LS1, a photoresist (photosensitive resist), a wax, a hot-melt material, a temporary bond, or the like, may be used. Further, a mixture of a liquid and a filler may be used as the fluidic material LS1.

17. Seventeenth (17 th) Step (Piezoelectric Material Layer Processing Step: Blast Processing)

Figure 20:
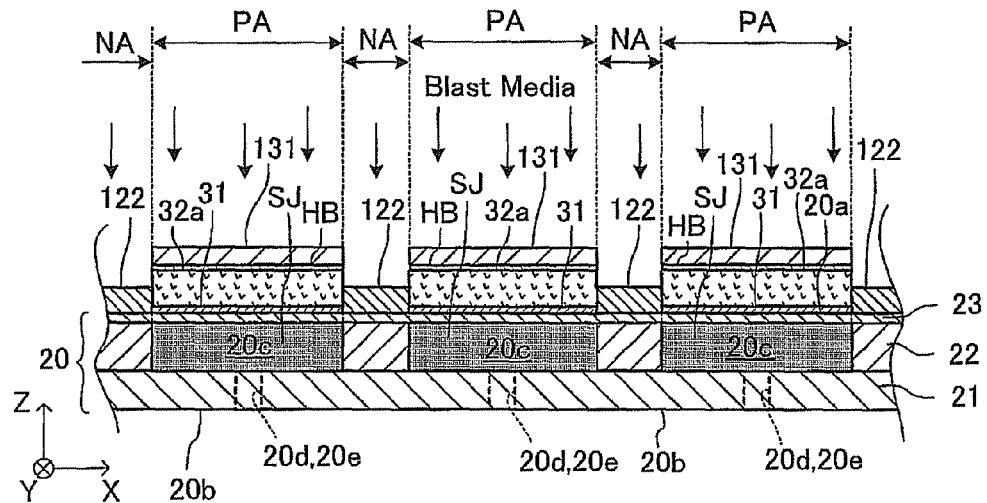
FIG. 20 is a figure to describe a seventeenth step of the first manufacturing method.

Subsequently, as shown in FIG. 20, a blast media is blasted (injected) toward "the first principal surface 20a of the substrate 20 (actually, to an upper surface of the piezoelectric material layer 32a and an upper surface of the first mask 131)" from the side of the first principal surface 20a. That is, a blast processing is performed. As a result, the piezoelectric material layer 32a where the first masks 131 do not exist (portions which are not covered by the first masks 131) is eliminated. Portions which are covered by the first masks 131 are not eliminated. The blast media includes at least one of "abrasive grains (powder) and an organic solvent".

More specifically, the blast media is preferably a slurry including abrasive grains (powder) whose particle diameter is "larger than or equal to 0.1 μm and smaller than or equal to 5.0 μm". A material of the abrasive grains may preferably be a ceramics having a high Mhos hardness, and more specifically, a material having 11 or more Mhos hardness, such as silicon carbide, oxidized aluminum, and oxidized zirconium. It is more preferable that the particle diameter of the abrasive grain included in the blast media be larger than or equal to 0.3 μm and smaller than or equal to 2.0 μm. A particle shape of the abrasive grain is any one of a polygonal shape, a spherical shape, a flat shape, and an indeterminate shape. The solvent included in the slurry is preferably a water or an organic solvent. Further, it is more preferable that, as the solvent included in the slurry, an organic solvent be selected, the organic solvent having a compatibility (or Solubility Parameter, SP value) closer to a compatibility of a paste resin (which is included to allow the piezoelectric ceramic powder to become the paste), in terms of workability of the piezoelectric material layer 32a (a piezoelectric ceramics) and a film (a dried film) obtained by drying the piezoelectric ceramic paste. Further, the blast media may not include the abrasive grains, but include only the organic solvent. In this case, the piezoelectric material layer 32a and the first mask 131 are eliminated by a swelling effect and the blast (injection) pressure.

In this step, the blast media is blasted (injected) using "a wet blast processing apparatus" or "a slurry spray apparatus". A blast air pressure (blast media injection pressure) is preferably "larger than or equal to 0.05 MPa and smaller than or equal to 0.5 MPa", and is more preferably "larger than or equal to 0.15 MPa and smaller than or equal to 0.25 MPa".

18. Eighteenth (18th) Step (Support Eliminating Step)

Figure 21:
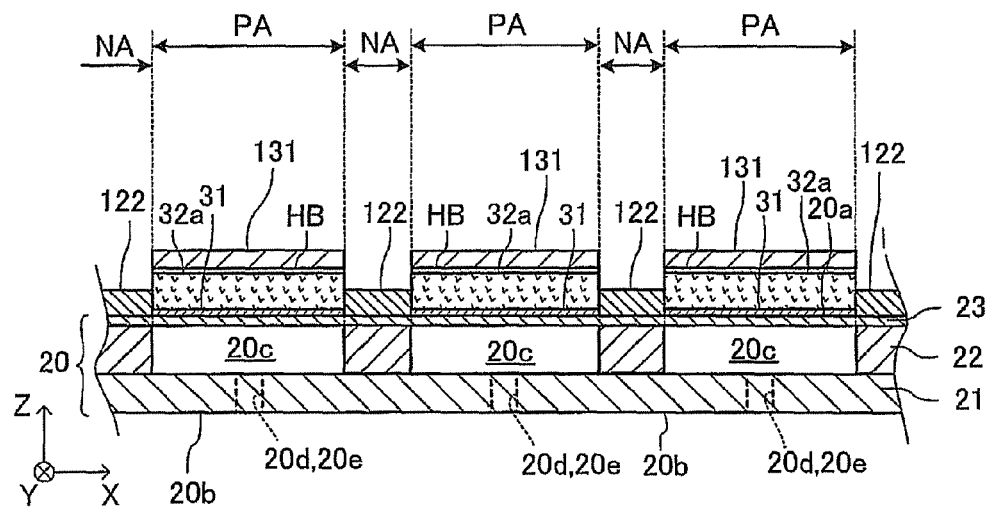
FIG. 21 is a figure to describe an eighteenth step of the first manufacturing method.

Subsequently, as shown in FIG. 21, the supports SJ in the hollow portions 20c are eliminated. The supports SJ are removed using a method depending on the material of the supports SJ (such as, a method of eliminating them by dissolving them into the organic solvent, a chemical removal method, and a method of eliminating them by heating and firing them). The supports SJ may be eliminated using a combination of methods described above.

19. Nineteenth (19th) Step (First Mask Eliminating Step and Second Mask Eliminating Step)

Figure 22:
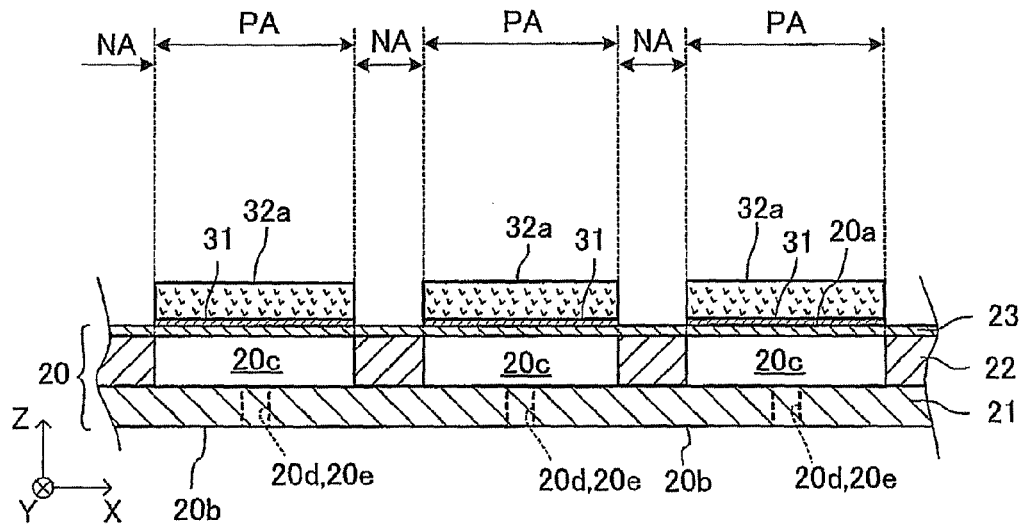
FIG. 22 is a figure to describe a nineteenth step of the first manufacturing method.
Figure 23:
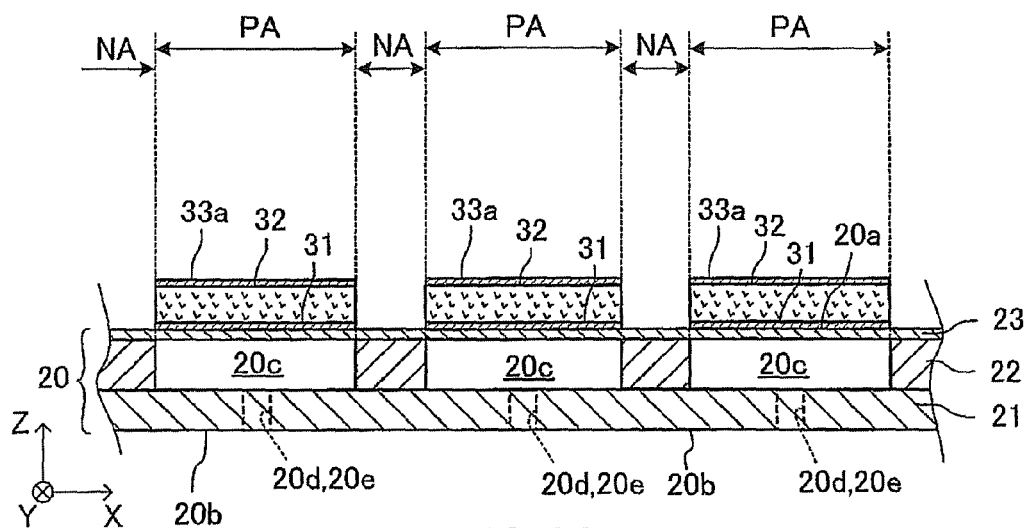
FIG. 23 is a figure to describe another step of the first manufacturing method.

Subsequently, the first masks 131 and the second masks 122 are eliminated (refer to FIG. 22). These masks are eliminated using a method depending on the material of the masks (such as, a method of eliminating them by dissolving them into the organic solvent, a chemical removal method, a method of eliminating them by heating and firing them). Further, these masks may be eliminated using a plasma ashing method, an organic substance cleaning method using an excimer laser irradiation, or the like. These masks may be eliminated using a combination of methods described above. In addition, in a case in which the middle layer for reaction prevention HB has been formed, the middle layer for reaction prevention HB is eliminated with a hot water (liquid temperature 60° C.). Examples of a method to eliminate the middle layer HB are, but not limited to, a spray atomization, a dipping/shaking, a showering, and the like. Further, the middle layer for reaction prevention may be eliminated using a spraying method using an air brush. Thereafter, the piezoelectric material layers 32a are fired to thereby form the piezoelectric membranes 32.

20. Twentieth (20th) Step (Other Step)

Thereafter, with using a method similar to the method to form the first to third masks described above, masks (fourth masks) are formed above the first principal surface 20a (on upper surfaces of the piezoelectric membranes 32 and the upper surface of the first principal surface 20a) in such a manner that the fourth masks exist at (within) the region NA other than the hollow portion projected region PA and do not exist at (within) the hollow portion projected region PA. Then, with utilizing the masks, "conductive material films 33a (conductive films for the second electrodes 33a) which will become the second electrodes 33" are formed. The conductive films for the second electrodes 33a are formed using a method similar to the method to form the conductive films for the first electrodes 31a (refer to the seventh step). Thereafter, the conductive films for the second electrodes 33a are fired to thereby form the second electrodes 33. Subsequently, the lower wiring electrodes (not shown) and the upper wiring electrodes (not shown) are formed. With these steps, the piezoelectric membrane type device 10 is manufactured.

Example

An example manufactured according to the above embodiment will next be described.

1. Composition of Materials of the Example

The composition of materials is as follows.
1.1 Substrate 20
Material of the substrate: Partially stabilized zirconium oxide
Thickness of the substrate: Thickness of the vibration plate 23=2 μm
Thickness of the middle plate 22=80 μm
Thickness of the lower plate 21=120 μm
Dimension of the hollow portion: Width W1=65 μm, Length W2=1 mm
Distance between hollow portions: L1=5 μm-30 μm
Firing temperature of the substrate: 1450° C.
Manufacturing method: Refer to the first step (the substrate preparing step)
1.2 Piezoelectric Material Layer 32a
Material: A ceramic paste including lead zirconate titanate (PZT) as a major component (a paste obtained by mixing (kneading) the PZT powder, a resin binder, and a solvent)
1.3 Material of the Masks (the First Mask 131, the Second Mask 122, and the Third Mask 112)
Negative type photosensitive resist (the second photosensitive film 120, the third photosensitive film 110)
Solid content concentration 50% (supplied by Nippon Kayaku Co., Ltd.)
Positive type photosensitive resist (the first photosensitive film 130)
Solid content concentration 30% (supplied by Tokyo Ohka Kogyo Co., Ltd.)
Material of the middle layer for reaction prevention
PVA (polyvinyl alcohol) resin
Solid content concentration 6%
1.4 Material of the Support SJ
Photosensitive resist
Solid content concentration 10% (supplied by Tokyo Ohka Kogyo Co., Ltd.)

2. Blast Processing 2.1 Blast Apparatus: Micro-Wet Blast Machine
2.2 Blast Media (Blasted Slurry)
Slurry concentration: 10 weight percent
Abrasive grain (powder): SiC (silicon carbide)
GC#8000 (particle diameter 1.2 μm)
Solvent: Acidum lacticum 3. Manufacturing Method 3.1 Forming of the First Electrode 31
The first electrode 31 was formed according to the second to eighth steps described above.
3.2 Forming of the Second Mask 122
The second mask 122 was formed according to the ninth to eleventh steps described above. The details are as follows.

In the ninth step, the second photosensitive film (the negative type photosensitive resist film) 120 to become the second mask 122 was formed (applied) using the spin coating. The rotational speed of the spin coating was 4500 rpm, and the spin coating was performed for 30 seconds. Thereafter, the second photosensitive film 120 was dried with the hot plate. As for the condition for drying, the drying temperature was 70° C., and drying time was 10 minutes.

In the tenth step, the irradiation light was irradiated to the first principal surface 20a from the side of the second principal surface 20b using an exposure apparatus (three wavelength, lamp output 250 w (igh)), so that the latent images of the first electrodes 31 were transcribed onto the second photosensitive film 120. The light intensity was 300 mJ/cm$^2$.

The developer used in the eleventh step was TMAH (tetramethylammonium hydroxide water solution whose concentration is 2.38%). Actually, the substrate on and above which the exposed second photosensitive film 120 was formed was dipped in the developer and was shaken in the developer to thereby form the second masks 122.

Thereafter, in order to further harden the thus formed second masks 122, the substrate on and above which the second masks 122 were formed was treated with heat using the hot plate. As for the condition of the heat treatment, the drying temperature 100° C. and the drying time (keeping duration) was 3 minutes.

It should be noted that the thickness (film thickness) of the second masks 122 was 8 μm (measured with a white light interferometric measuring system).

3.3 Forming of the Piezoelectric Material Layer 32a

The piezoelectric material layer 32a was formed (applied) using the spin coating (the rotational speed of the spin coating was 3500 rpm, and the spin coating was performed for 15 seconds) according to the twelfth step described above. The piezoelectric material layer 32a was applied onto the entirety of the upper surface (including the upper surface of the first electrodes 31) of the first principal surface 20a of the substrate 20. Thereafter, the piezoelectric material layer 32a was dried with the hot plate. As for the condition of the drying, the drying temperature was 120° C., and the drying time (keeping duration) was 5 minutes.

It should be noted that the thickness (film thickness) of the piezoelectric material layer 32a was 5 μm (measured with the white light interferometric measuring system).

3.3.1 Forming of the Middle Layer for Reaction Prevention

The middle layer for reaction prevention HB was formed as follows.

The PVA (polyvinyl alcohol) hydrophilic resin solution whose concentration was 6% was applied onto the entirety of the upper surface of the piezoelectric material layer 32a using the spin coating (the rotational speed of the spin coating was 5000 rpm, and the spin coating was performed for 15 seconds).

Thereafter, the solution was dried with the hot plate. As for the condition of the drying, the drying temperature was 150° C., and the drying time (keeping duration) was 3 minutes. As a result, the middle layer for reaction prevention HB was formed on the entirety of the upper surface of the piezoelectric material layer 32a.

It should be noted that the thickness (film thickness) of the middle layer for reaction prevention HB was 0.5 μm (measured with the white light interferometric measuring system).

3.4 Forming of the First Mask 131

The first masks 131 were formed according to the thirteenth to fifteenth steps. The details are as follows.

In the thirteenth step, the first photosensitive film (the positive type photosensitive resist film) 130 to become the first masks 131 was formed using the spin coating. The rotational speed of the spin coating was 2000 rpm, and the spin coating was performed for 15 seconds. Thereafter, the first photosensitive film 130 was dried with the hot plate. As for the condition for drying, the drying temperature was 100° C., and the drying time (keeping duration) was 5 minutes. As a result, the first photosensitive film 130 was formed on the entirety of the upper surface of the middle layer for reaction prevention HB.

In the fourteenth step, the irradiation light was irradiated to the first principal surface 20a from the side of the second principal surface 20b using an exposure apparatus (three wavelength, lamp output 250 w (igh)), so that the latent images of the first electrodes 31 were transcribed onto the first photosensitive film 130. The light intensity was 500 mJ/cm$^2$.

The developer used in the fifteenth step was a solution containing sodium hydroxide (concentration is 1%). Actually, the substrate 20 above which the exposed first photosensitive film 130 was formed was dipped in the developer and was shaken in the developer to thereby form the first masks 131.

Thereafter, in order to further harden the thus formed first masks 131, the substrate 20 above which the first masks 131 were formed was treated with heat using the hot plate. As for the condition of the heat treatment, the drying temperature 100° C., and the drying time (keeping duration) was 3 minutes.

It should be noted that the thickness (film thickness) of the first masks 131 was 5 μm (measured with a white light interferometric measuring system).

Subsequently, the middle layer for reaction prevention MB was eliminated by spraying the hot water (liquid temperature 60° C.) using the air brush (for 1 minute). The shape of the middle layer for reaction prevention HB after the elimination when viewed in plan became the same as the shape of the first mask 131 when viewed in plan. Thereafter, the thus formed middle layer for reaction prevention HB was dried with the hot plate. As for the condition for drying, the drying temperature was 100° C., and the drying time (keeping duration) was 5 minutes.

3.5 Forming of the Support SJ

The supports SJ were formed according to the sixteenth step described above. In the present example, the fluidic photosensitive resin (fluidic material) LS1 was introduced (filled) into the hollow portions 20c through the communicating passages 20d. Thereafter, the irradiation light was irradiated to the first principal surface 20a from the side of the second principal surface 20b using an exposure apparatus (three wavelength, lamp output 250 W (igh)) to expose the photosensitive resin LS1. As a result, the fluidic material LS1 was hardened to become the supports SJ. The light intensity was 300 mJ/cm$^2$. Subsequently, in order to harden the thus formed supports SJ, the substrate 20 in which the supports SJ were formed was treated by heat using the hot plate. As for the condition for the heat treatment, the drying temperature was 100° C., and the drying time (keeping duration) was 10 minutes.

3.6 Elimination of the Piezoelectric Material Layer (Blast Processing)

The piezoelectric material layer 32a was eliminated (blast processed) according to the seventeenth step. In the present example, the micro-wet blast machine was used. The concentration of the slurry serving as the blast media was 10 weight percent. The blast air pressure was 0.15 MPa. Further, a blast gun (a direction of blast) was tilted by 30° with respect to a normal direction of the first principal surface 20a of the substrate 20 to inject the blast media. "Setting the direction of the blast (injection) of the blast media in such a manner that the direction is not orthogonal to the first principal surface 20a" allows the blast media (the slurry) to flow out in the direction parallel to the first principal surface 20a, and therefore, it can be avoided with more certainty for the substrate 20 to break (crack).

Further, a processing rate of the piezoelectric material layer 32a was previously calculated, and an accumulated (total) processing time was obtained. The above blast processing was performed for the obtained accumulated processing time.

3.7 Elimination of the Supports SJ

The supports SJ were eliminated using the chemical removal method according to the eighteenth step described above.

3.8 Elimination of the First Masks 131 and the Second Masks 122

"The first masks 131 and the second masks 122" were eliminated according to the nineteenth step described above. Actually, the substrate 20 above which the piezoelectric material layer 32a and so on were formed was dipped in the solution containing sodium hydroxide (concentration is 4%) serving as a resist-release-liquid, and was shaken in the solution so that "the first masks 131 and the second masks 122" were eliminated. Further, the middle layer for reaction prevention HB was eliminated using the hot water (liquid temperature 60° C.).

<Comparison of Processing Rate in the Blast Processing>

Figure 24:
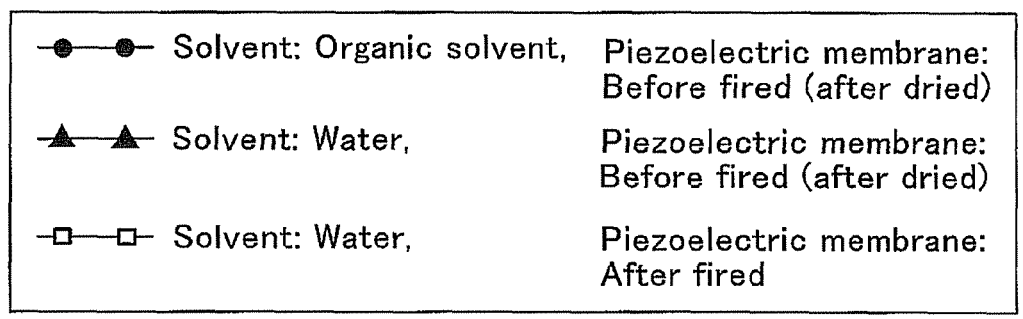
FIG. 24 is a graph showing processing rates of embodiments manufactured according to the first manufacturing method and a comparative example.
Figure 24:
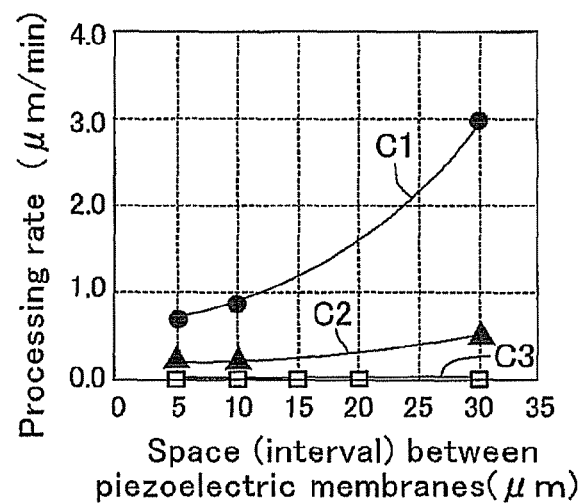

Next, the processing rates (blast processing speed) of the piezoelectric membrane (piezoelectric material layer) 32a formed according to the method described above were measured. At this time, as a comparative example, a sample of the piezoelectric membrane (piezoelectric material layer) 32a which had been fired was similarly blast processed. In addition, the processing rates were measured with respect to samples where either "a water or an organic solvent" was used as the solvent included in the blast media, and samples having various distances (intervals) between the hollow portions. The measurement result is shown in FIG. 24. The table 1 below explains lines C1 to C3 shown in FIG. 24. It should be noted that the abrasive grains included in the blast media used for those samples are the same as each other.

TABLE 1

|  |  | Piezoelectric membrane processed | |
| --- | --- | --- | --- |
|  |  | body before fired (after dried) (piezoelectric material layer 32a) | fired body |
| solvent type | organic solvent | line C1 (plot: ●) | — |
|  | water | line C2 (plot: ▲) | line C3 (plot: □) |

It is understood from FIG. 24 that the processing rate is much higher when the piezoelectric membrane which is an object for the processing is "a ceramic green sheet (after dried) which has not been fired as in the first manufacturing method" than the processing rate when the piezoelectric membrane which is an object for the processing is "a fired piezoelectric body (fired body)". Further, when the piezoelectric membrane which is the object for the processing is "the ceramic green sheet (after dried) which has not been fired as in the first manufacturing method", the processing rate becomes extremely large if the organic solvent is used as the solvent of the blast media. Accordingly, it turned out that it is extremely effective that "the ceramic green sheet (after dried) which has not been fired" is adopted as the piezoelectric membrane which is the object for the blast processing, and "the organic solvent" is used as the solvent of the blast media, in order to form a high-density pattern of the piezoelectric membrane. That is, it is confirmed that the piezoelectric membrane type device 10 (e.g., an ink jet actuator) having the extremely small spaces (intervals) L1 between hollow portions can be manufactured with high accuracy and within a short time of period, according to the first manufacturing method (as well as the other embodiments of the present invention described later).

Modified Example of the First Manufacturing Method

Next, there will be described modified examples of the first manufacturing method. The examples described below may be combined with each other, as long as there is no inconsistency.

First Modified Example

The second masks 122 are formed according to the first manufacturing method, however, the second masks 122 may not necessarily be required to be formed. That is, the ninth to eleventh steps can be omitted. In this case, only the first masks 131 are eliminated in the nineteenth step. In other words, the second mask eliminating step is omitted.

Second Modified Example

The piezoelectric material layer processing step (the seventeenth step) is carried out under the condition in which (while) the supports SJ are maintained in the hollow portions 20c, according to the first manufacturing method. However, the supports SJ may not necessarily be required to be formed in the hollow portions 20c, if it is unlikely that the vibration plate 23 is broken, such as a case where the strength of the vibration plate 23 is high, and/or, the blast media injection pressure is low. In this case, the support forming step (the sixteenth step) and the support eliminating step (the eighteenth step) are omitted.

Third Modified Example

According to the first manufacturing method, the support forming step (the sixteenth step) is carried out (performed) after the exposed portion of the first photosensitive film eliminating step (the fifteenth step) and before the piezoelectric material layer processing step (the seventeenth step). However, the support forming step (the sixteenth step) may be carried out at any time prior to the piezoelectric material layer processing step (the seventeenth step). Accordingly, for example, the support forming step (the sixteenth step) may be performed before the exposed portion of the first photosensitive film eliminating step (the fifteenth step) (e.g., between the piezoelectric material layer forming step (the twelfth step) and the first photosensitive film forming step (thirteenth step), and, between the first photosensitive film forming step (thirteenth step) and the first photosensitive film exposure step (the fourteenth step)).

Fourth Modified Example

In place of the support forming step (the sixteenth step) of the first manufacturing method, another support forming step (hereinafter referred to as "a first light shield and support forming step") may be carried out before the first exposure step (the fourteenth step). For example, "the first light shield and support forming step" may be performed after the first photosensitive film forming step (thirteenth step) and before the first exposure step (the fourteenth step), may be performed after the piezoelectric material layer forming step (the twelfth step) and before the first photosensitive film forming step (thirteenth step), or may be performed after the non-exposed portion of the second photosensitive film eliminating step (the eleventh step) and before the piezoelectric material layer forming step (the twelfth step).

In the first light shield and support forming step, a fluidic material is introduced into the hollow portions 20c, the fluidic material being a material containing the light shielding material (the dye, the pigment, or the like, as described above) and being able to be hardened as "the fluidic material LS1 to be the support SJ". Such a fluidic material is a material having the light shielding material which is dispersed or dissolved in the fluidic material LS1. After the fluidic material is introduced into the hollow portions 20c, the fluidic material is hardened by heat, or the like. As a result, "the supports having a light shielding function (a first light shield and support)" are formed in the hollow portions 20c.

After the first light shield and support forming step is carried out, the blast media is injected under the condition that the first light shield and support has been formed in the hollow portion 20c. As a result, it is possible to avoid the deformation or the breakage of the boundary portion (that is, the vibration plate 23) between the hollow portions 20c and the piezoelectric devices 30.

The middle layer for reaction prevention forming step may be carried after the piezoelectric material layer forming step (the twelfth step) and before the first photosensitive film forming step (thirteenth step). Further, the middle layer for reaction prevention forming step may be omitted, if the material of the first photosensitive film is "a material whose dissolution ability is low, or a resin material whose hydrophilicity is high" (that is, if the dissolution reaction between the piezoelectric material layer 32a and the first photosensitive film 130 hardly occurs).

Further, the first light shield and support forming step is carried out before the first exposure step (the fourteenth step). Accordingly, when the irradiation light is irradiated in the first exposure step (the fourteenth step), the hardened body (a mask: the first light shield and support) containing the light shielding material exists in the hollow portion 20c. The irradiation light is therefore shielded/blocked not only by the first electrode 31 but also by the first light shield and support in the hollow portion 20c. As a result, the accuracy in the position and the shape of "the portion (the exposed first photosensitive film 132) of the first photosensitive film which is exposed in the first exposure step (the fourteenth step)" is improved. It should be noted that the first light shield and support is eliminated in the support eliminating step (the eighteenth step).

Fifth Modified Example

The third masks 112 are once eliminated in the third mask eliminating step (the eighth step), and thereafter, the second masks 122 are formed, according to the first manufacturing method. However, the third masks 112 may be used as the second masks 122. In this case, the steps from the third mask eliminating step (the eighth step) to the non-exposed portion of the second photosensitive film eliminating step (the eleventh step) can be omitted.

Sixth Modified Example

The light shielding material LS3 is eliminated in the third light shielding material eliminating step (the sixth step) according to the first manufacturing method. However, the third light shielding material eliminating step (the sixth step) may be carried out at any time after the first photosensitive film exposure step (the fourteenth step) and before the support forming step (the sixteenth step).

According to the sixth modified example, the second exposure step (the tenth step) and the first exposure step (the fourteenth step) are carried out under the condition that (while) the light shielding material LS3 exists in each of the hollow portions 20c. As a result, accuracy (exposure accuracy) in shapes of portions to be exposed in the second exposure step (the tenth step) and the first exposure step (the fourteenth step) is improved. Further, the exposure in the second exposure step (the tenth step) and in the first exposure step (the fourteenth step) can be carried out with certainty, even if the first electrode 31 is composed of a material through which the irradiation light can pass, and/or, if the first electrode 31 has a thickness that allows the irradiation light to pass through the first electrode 31.

Seventh Modified Example

The light shielding material LS3 is eliminated in the third light shielding material eliminating step (the sixth step) according to the first manufacturing method. However, the third light shielding material eliminating step (the sixth step) may be carried out at any time after the second exposure step (the tenth step) and before the support forming step (the sixteenth step).

According to the seventh modified example, the second exposure step (the tenth step) is carried out under the condition that (while) the light shielding material LS3 exists in each of the hollow portions 20c. As a result, accuracy (exposure accuracy) in shapes of portions to be exposed in the second exposure step (the tenth step) is improved.

Eighth Modified Example

The third mask eliminating step (the eighth step) is carried out before the second photosensitive film forming step (the ninth step) according to the first manufacturing method. However, the third mask eliminating step (the eighth step) may be carried out at any time before the piezoelectric material layer forming step (the twelfth step). That is, third mask eliminating step (the eighth step) may be carried out, for example, after the second photosensitive film forming step (the ninth step) and before the second exposure step (the tenth step), after the second exposure step (the tenth step) and before the non-exposed portion of the second photosensitive film eliminating step (the eleventh step), or after the non-exposed portion of the second photosensitive film eliminating step (the eleventh step) and before the piezoelectric material layer forming step (the twelfth step).

Ninth Modified Example

Further, in the third light shielding material filling step (the third step), the material containing the light shielding material which is introduced into the hollow portions 20c may be the fluidic material, and "hardening the fluidic material filled into the hollow portions 20c (forming a hardened body)" before irradiating the light to expose the third photosensitive film 110 may be included in the third light shielding material filling step (the third step). In this case, the third mask eliminating step (the eighth step) may be carried out after the piezoelectric material layer processing step (the seventeenth step), and the piezoelectric material layer processing step (the seventeenth step) may be a step in which the blast media is blasted under the condition that (while) the hardened bodies formed in the third light shielding material filling step (the third step) are maintained in the hollow portions 20c.

According to the ninth modified example, "the light shielding material introduced into the hollow portion 20c" used to form "the third mask 112 to form the conductive material film 31a" can be utilized as "the support in the piezoelectric material layer processing step (the seventeenth step) (the hardened body which functions to avoid the deformation or the breakage of the vibration plate 23 while the blast media is blasted)". That is, the light shields used in the third mask forming step (in actuality, the third exposure step which is the fourth step), the light shields used in the first exposure step (the fourteenth step), and the supports used in the piezoelectric material layer processing step (the seventeenth step) can be formed in a single step (the third light shielding material filling step which is the third step). Accordingly, the manufacturing processes can be simplified.

Tenth Modified Example

In the ninth modified example, "the fluidic material introduced into the hollow portions 20c" is hardened in the third light shielding material filling step (the third step). Alternatively, a first hardened body forming step may be included in which a first hardened body is formed by hardening the fluidic material introduced into the hollow portions 20c in the third light shielding material filling step (the third step), the first hardened body forming step being performed after the non-exposed portion of the third photosensitive film eliminating step (fifth step) and before the piezoelectric material layer processing step (the seventeenth step), without hardening "the light shielding material introduced into the hollow portions 20c" in the third light shielding material filling step (the third step). In this case, the piezoelectric material layer processing step (the seventeenth step) is preferably a step in which the blast media is injected under the condition that (while) the first hardened bodies are maintained in the hollow portions 20c.

According to the tenth modified example, the material to be the light shields used in the fourth step (the third exposure step), the material to be the light shields used in the second exposure step (the tenth step) and in the first exposure step (the fourteenth step), and the material to be the supports used in the piezoelectric material layer processing step (the seventeenth step) can be introduced into the hollow portions 20c in the single third light shielding material filling step (the third step). Accordingly, the manufacturing processes can be simplified. It should be noted that the first hardened body forming step may be carried out after the third mask 112 is formed and before the first exposure step (the fourteenth step) is carried out.

Eleventh Modified Example

In the above embodiments, a light shielding material re-filling step may be included, the light shielding material re-filling step being carried out after the third light shielding material eliminating step (the sixth step, the material for exposure of the third photosensitive film eliminating step) and before the first exposure step (the fourteenth step), and the light shielding material re-filling step being a step in which a material containing a light shielding material is re-filled into the hollow portions 20c. In this case, the first exposure step (the fourteenth step) may be a step in which the light shielding material re-filled in the hollow portions 20c in the light shielding material re-filling step is used (functioned) as masks in addition to the conductive material films 31a to expose the first photosensitive film 130.

It should be noted that the light shielding material re-filling step may be more preferably performed after the sixth step (the material for exposure of the third photosensitive film eliminating step, the third light shielding material eliminating step) and before the second exposure step (the tenth step). This also allows the light shielding material re-filled in the hollow portions 20c in the light shielding material re-filling step to function (be used) as masks in addition to the conductive material films 31a to expose the second photosensitive film 120 in the second exposure step as well.

Twelfth Modified Example

The material containing the light shielding material re-filled in the hollow portions 20c in the light shielding material re-filling step of the eleventh modified embodiment may be a fluidic material. In this case, a second hardened body forming step may be included, the second hardened body forming step being carried out after the light shielding material re-filling step and before the piezoelectric material layer processing step (the seventeenth step), and being a step in which the fluidic material re-filled in the hollow portions 20c in the light shielding material re-filling step is hardened to thereby form the second hardened bodies. Further, the piezoelectric material layer processing step (the seventeenth step) may preferably be a step in which the blast media is blasted under the condition that (while) the second hardened bodies are maintained in the hollowing portions 20c.

According to the twelfth modified example, the material in the hollow portions 20c (the light shielding material re-filled in the hollow portions 20c in the light shielding material re-filling step) used as the masks for the irradiation light in the first exposure step (the fourteenth step) can be used as the supports in the piezoelectric material layer processing step (the seventeenth step). That is, the material used as the light shields in the first exposure step (the fourteenth step) and the material used as the supports in the piezoelectric material layer processing step (the seventeenth step) can be introduced into the hollow portions 20c in a single step. Accordingly, the manufacturing processes can be simplified.

In this case, the second hardened body forming step may be carried out before the first exposure step (the fourteenth step).

Thirteenth Modified Example

In the first mask and second mask eliminating step (the nineteenth step) of the first manufacturing method, the first masks 131 and the second masks 122 are eliminated by the same organic solvent in the single step. However, the first mask 131 and the second mask 122 may be eliminated in not less than two steps. That is, the first masks 131 and the second masks 122 may be eliminated with organic solvents different from each other, or may be eliminated using methods different from each other. In this case, either the first mask eliminating step or the second mask eliminating step may be carried out prior to the other step, as long as the steps are performed after the seventeenth step (the piezoelectric material layer processing step).

As described above, each of the first manufacturing method and its modifications is a method for manufacturing the piezoelectric membrane type device 10 which includes the substrate 20, and the piezoelectric device 30 having the piezoelectric membrane 32 and provided on the first principal surface 20a of the substrate, the method comprising, (a) the substrate preparing step of preparing the substrate (refer to FIG. 4);

(b) the piezoelectric material layer forming step of forming, above the first principal surface 20a of the substrate, the piezoelectric material layer 32a which is the layer including the piezoelectric material to be changed into the piezoelectric membrane by being fired (refer to FIG. 15);

(c) the first mask forming step of forming the first mask 131 above the piezoelectric material layer 32a (refer to FIGS. 16 to 18);

(d) the piezoelectric material layer processing step of eliminating the piezoelectric material layer 32a existing in the portion on which the first mask 131 does not exist by injecting the blast media including at least one of the abrasive grains and the organic solvent to the first principal surface 20a of the substrate (refer to FIG. 20);

(e) the first mask eliminating step of eliminating the first mask (refer to FIG. 22); and (f) the firing step of firing the piezoelectric material layer.

Accordingly, the piezoelectric material layer which has not been fired is blast-processed in the piezoelectric material layer processing step. As a result, the blast processing can be completed within a short time.

<Second Manufacturing Method>

"A method for manufacturing the piezoelectric membrane type device (hereinafter, referred to as "a second manufacturing method")" according to a second embodiment of the present invention will next be described. A substrate of the piezoelectric membrane type device does not include hollow portions, however, the substrate may include the hollow portions.

1. First (1st) Step (Substrate Preparing Step)

Figure 25:
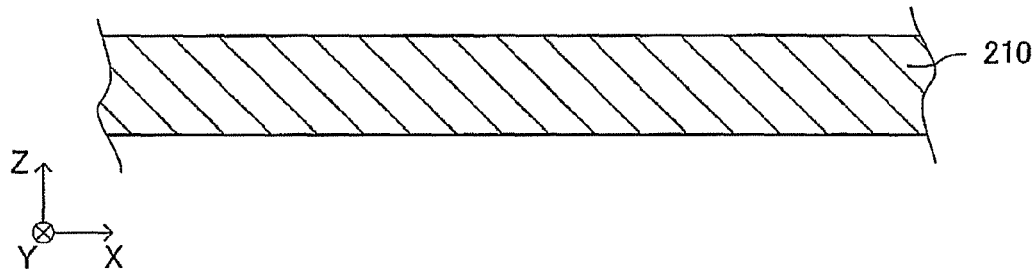
FIG. 25 is a figure to describe a first step of a method for manufacturing a piezoelectric membrane type device according to a second embodiment (a second manufacturing method) of the present invention.

First, the substrate 210 shown in FIG. 25 is formed (prepared). For example, the substrate 210 is formed by firing after degreasing a plurality of ceramic green sheets that are layered (laminated) each other and thermal compression bonded.

2. Second (2nd) Step (Lower Electrode(s) Forming Step)

Figure 26:
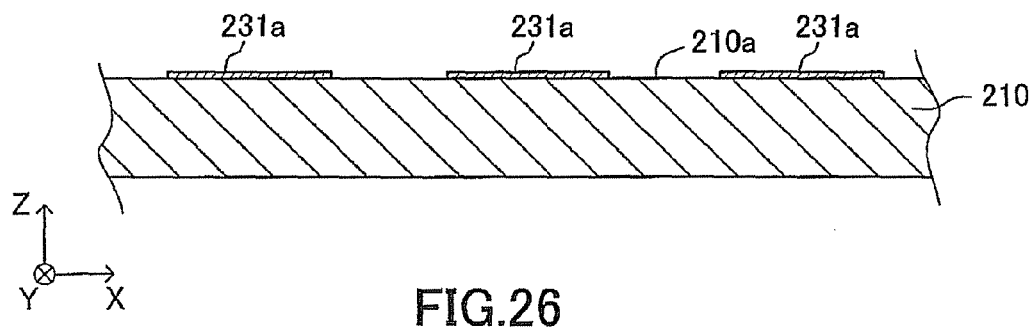
FIG. 26 is a figure to describe a second step of the second manufacturing method.

Subsequently, as shown in FIG. 26, "conductive material films 231a (conductive films 231a for first electrodes) which will become first electrodes (lower electrodes)" are formed on a first principal surface 210a of the substrate 210. There is not a limit on a method of forming the conductive material films 231a, however, it is preferable that the conductive material films 231a is formed according to one of methods (1) to (3) described below, for example.

(1) A conductive paste is applied using a screen printing method etc. Thereafter, the disperse media included in the applied conductive paste is eliminated by evaporating the disperse media.

(2) A conductive resinate is applied using a spin coating method, a spray method, or the like. Thereafter, the solvent included in the applied conductive resinate is eliminated by evaporating the solvent.

(3) A conductive material is plated to be a film on the upper surface of the first principal Surface 210a using a nonelectrolytic plating method.

3. Third (3rd) Step (Eleventh Photosensitive Film Forming Step)

Figure 27:
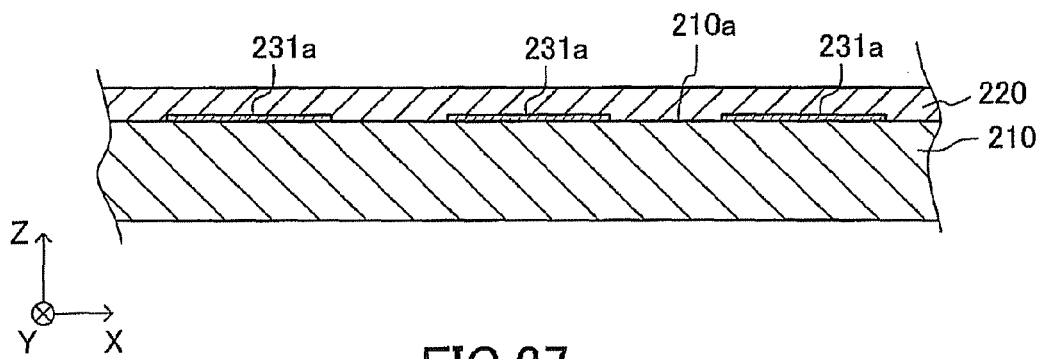
FIG. 27 is a figure to describe a third step of the second manufacturing method.

Next, as shown in FIG. 27, a photoresist film 220 is formed on an upper surface of the first principal surface 210a of the substrate 210. The photoresist film 220 is referred to as "an eleventh photosensitive film 220" for convenience. The eleventh photosensitive film 220 is formed so as to cover an entire area of the first principal surface 220a. The eleventh photosensitive film 220 is formed (applied) by, for example, any one of spin coating, slit coating, roll coating, spraying, screen printing, and the like. Further, the eleventh photosensitive film 220 may be formed by applying a photosensitive dry film resist.

A thickness of the eleventh photosensitive film 220 is sufficiently large, as compared with a thickness of the conductive material films 231a. The eleventh photosensitive film 220 is either one of the "negative (negative type)" photoresist film whose dissolution ability in the developer (the organic solvent) becomes lower after it is exposed and the "positive (positive type)" photoresist film whose dissolution ability in the developer (the alkaline aqueous solution or the organic solvent) becomes higher after it is exposed. It should be noted that, in the present example, the eleventh photosensitive film 220 is composed of the negative type photoresist film. Examples of a material of the eleventh photosensitive film 220 include, but are not limited to, a photosensitive resin, such as acrylic, epoxy, polyimide, or fluorine photosensitive resin. Further, the material of the eleventh photosensitive film 220 may be a chemical-resistant protective material. It is more preferable that the eleventh photosensitive film 220 be a chemically-amplified photoresist film, in terms of a resolution for pattern formation.

4. Fourth (4th) Step (Eleventh Photosensitive Film Exposure Step)

Figure 28:
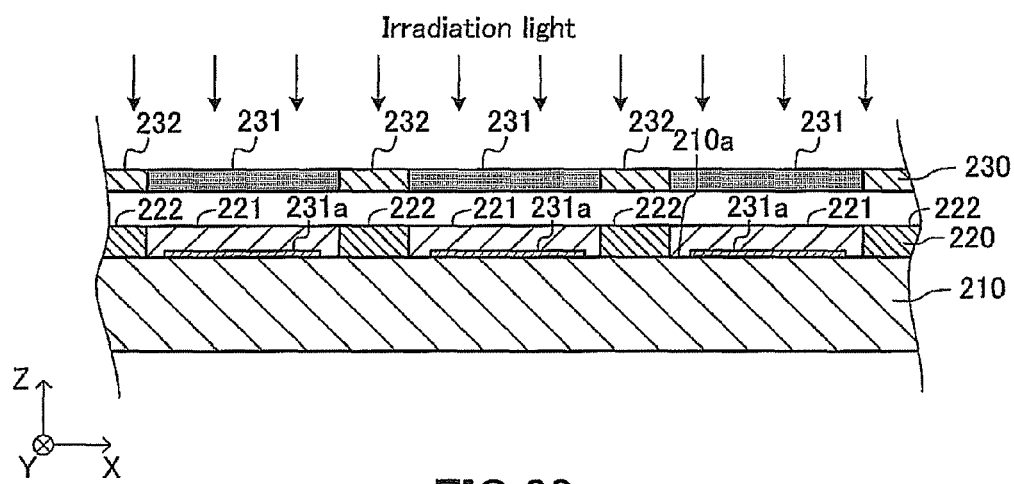
FIG. 28 is a figure to describe a fourth step of the second manufacturing method.

Subsequently, as shown in FIG. 28, a mask 230 is placed. The mask 230 is referred to as "an eleventh mask 230" for convenience. The eleventh mask 230 is a silica glass mask. That is, a substrate of the eleventh mask 230 is made of a silica glass having a light permeability, and chrome is deposited (evaporated) on the substrate. Portions on which the chrome is deposited constitute light shielding/blocking portions 231, and the other portions constitutes light permeable portions 232. Each of the light shielding portions 231 is formed to have a position and a shape to cover each of the conductive material films 231a, when the eleventh mask 230 is kept in such a manner that a principal surface of the eleventh mask 230 is parallel to the first principal surface 210a of the substrate 210, and a position of the eleventh mask 230 is adjusted in a plane (the X-Y plane) parallel to the main surface.

Subsequently, "a light which is directed to the first principal surface 210a from an upper position of the eleventh mask 230, and is parallel to the first principal surface orthogonal direction (light along the Z-axis positive direction)" is irradiated. The irradiated light can pass through the light permeable portions 232 of the eleventh mask 230, however, can not pass through the light shielding portions 231 of the eleventh mask 230. As a result, the eleventh photosensitive film 220 is change into portions (non-exposed portions) 221 which are not exposed and portions (exposed portions) 222 which are exposed.

5. Fifth (5th) Step (Non-Exposed Portion of the Eleventh Photosensitive Film Eliminating Step)

Figure 29:
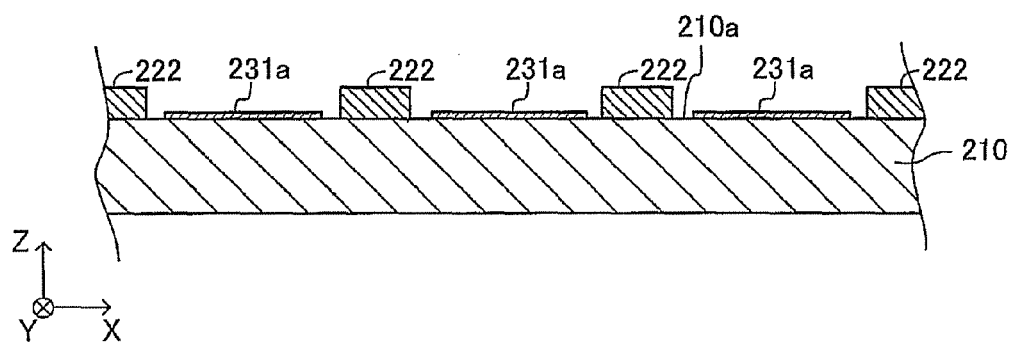
FIG. 29 is a figure to describe a fifth step of the second manufacturing method.

Subsequently, "the non-exposed portions 221 of the eleventh photosensitive film 220" is eliminated with (using) the developer (the alkaline aqueous solution or the organic solvent). As a result, as shown in FIG. 29, only the exposed portions 222 remain (or are left). Thereafter, the exposed portions 222 may be heated by heating the entire substrate 210 with a hot plate to thereby further harden the exposed portions 222.

6. Sixth (6th) Step (Piezoelectric Material Layer Forming Step)

Figure 30:
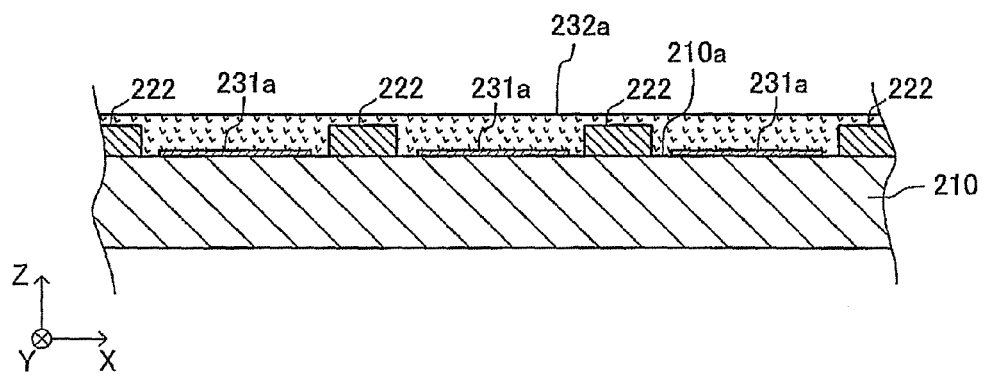
FIG. 30 is a figure to describe a sixth step of the second manufacturing method.

Subsequently, as shown in FIG. 30, a piezoelectric material layer 232a is formed above the first principal surface 210a of the substrate 210. More specifically, a piezoelectric ceramic paste is applied on "upper surfaces of the conductive material films 231a and upper surfaces of the exposed portions 222" so as to form the piezoelectric material layer 232a. There is not a limit on a method of applying the piezoelectric ceramic paste, however, for example, the wet applying method, such as spin coating, slit coating, roll coating, sol-gel method, spraying, and screen printing, or the electrophoresis method using the lower electrode pattern as an electrode may preferably be used. The piezoelectric ceramic paste used in this step is the same as the piezoelectric ceramic paste used in the first manufacturing method. It should be noted that the piezoelectric material layer 232a may be formed using ion-beam, sputtering, vacuum deposition, PVD, ion plating, CVD, or the like, in place of applying the ceramic paste.

At this point, a middle layer for reaction prevention HB (not shown) may be formed above (or on an upper surface of) the piezoelectric material layer 232a. The middle layer for reaction prevention HB is a film to prevent dissolution reaction between the piezoelectric material layer 232a and a twelfth photosensitive film 240 which will be formed above the piezoelectric material layer 232a (refer to a twelfth photosensitive film forming step described later). A material and a forming method of the middle layer for reaction prevention HB are the same as the material and a forming method of the middle layer for reaction prevention HB described in the first embodiment, respectively. It should be noted that this middle layer for reaction prevention forming step may be carried out as may be necessary.

7. Seventh (7 th) Step (Twelfth Photosensitive Film Forming Step)

Figure 31:
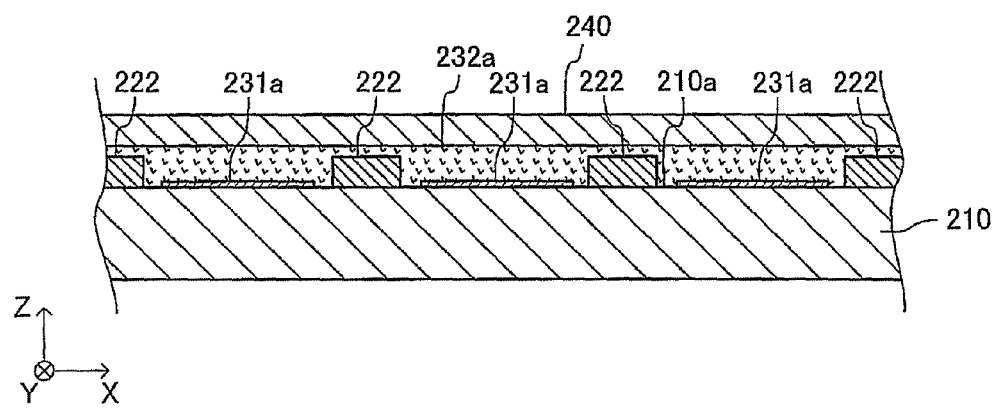
FIG. 31 is a figure to describe a seventh step of the second manufacturing method.

Subsequently, as shown in FIG. 31, a photoresist film 240 is formed above the piezoelectric material layer 232*a* (on the upper surface of the piezoelectric material layer 232*a* when the middle layer for reaction prevention HB is not provided, or on the upper surface of the middle layer for reaction prevention HB when the middle layer for reaction prevention HB is provided). The photosensitive film 240 is referred to as "a twelfth photosensitive film" or "a first photosensitive film" for convenience. The twelfth photoresist film 240 is formed so as to cover an entire area of the piezoelectric material layer 232*a*. It is preferable that the twelfth photosensitive film 240 be formed above the piezoelectric material layer 232*a* through attaching a photosensitive resin sheet, in terms of reactivity with the piezoelectric material layer 232*a* (piezoelectric ceramic paste). It should be noted that the first photosensitive film 130 may be formed (applied) by, for example, any one of spin coating, slit coating, roll coating, spraying, screen printing, and so on.

The twelfth photosensitive film 240 is either one of the negative type photoresist and the positive type photoresist film. It should be noted that, in the present example, the twelfth photosensitive film 240 is composed of the positive type photoresist film. Examples of a material of the twelfth photosensitive film 240 include, but are not limited to, "a photosensitive resin or a photosensitive chemical-resistant protective material", that is rubber-based, urethane, epoxy, polyimide, and fluorine etc.

8. Eighth (8th) Step (Twelfth Photosensitive Film Exposure Step)

Figure 32:
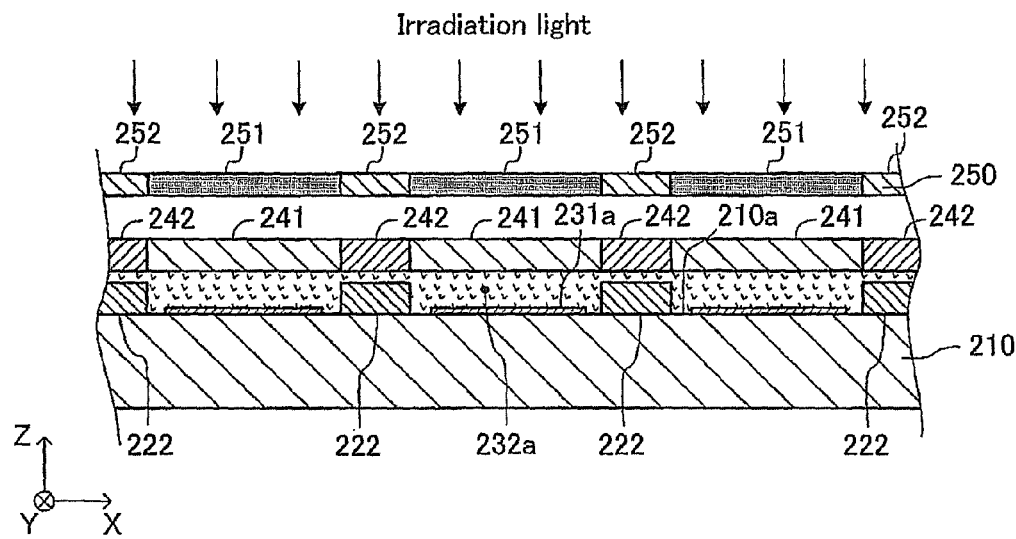
FIG. 32 is a figure to describe an eighth step of the second manufacturing method.

Subsequently, as shown in FIG. 32, the mask 250 is placed. The mask 250 is referred to as "a twelfth mask 250" for convenience. The twelfth mask 250 is a silica glass mask similar to the eleventh mask 230. The twelfth mask 250 is therefore comprises light shielding/blocking portions 251 and light permeable portions 252. Each of the light shielding portions 251 is formed to have a position and a shape to cover each of the conductive material films 231*a*, when the twelfth mask 250 is kept in such a manner that a principal surface of the twelfth mask 250 is parallel to the first principal surface 210*a* of the substrate 210, and a position of the twelfth mask 250 is adjusted in a plane (the X-Y plane) parallel to the main surface. In other words, each of the light permeable portions 252 is formed to have a position and a shape which coincide with the position and the shape of each of the exposed portions 222 when viewed in plan, respectively, when the twelfth mask 250 is kept in such a manner that the principal surface of the twelfth mask 250 is parallel to the first principal surface 210*a* of the substrate 210, and the position of the twelfth mask 250 is adjusted in the plane (the X-Y plane) parallel to the main surface.

Subsequently, "a light which is directed to the first principal surface 210*a* from an upper position of the twelfth mask 250, and is parallel to the first principal surface orthogonal direction (light along the Z-axis positive direction)" is irradiated. The irradiated light can pass through the light permeable portions 252 of the twelfth mask 250, however, can not pass through the light shielding portions 251 of the twelfth mask 250. As a result, the twelfth photosensitive film 240 is change into portions (non-exposed portions) 241 which are not exposed and portions (exposed portions) 242 which are exposed. That is, the eighth step is a exposure step of exposing a part of the twelfth photosensitive film (the first photosensitive film).

9. Ninth (9th) Step (Exposed Portion of the Twelfth Photosensitive Film Eliminating Step)

Figure 33:
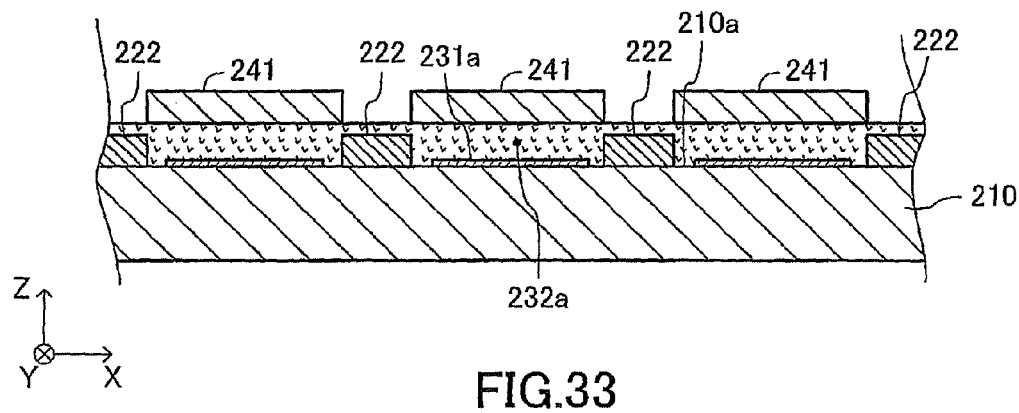
FIG. 33 is a figure to describe a ninth step of the second manufacturing method.

Subsequently, "the exposed portion 242 of the twelfth photosensitive film 240" is eliminated with (using) the developer (the alkaline aqueous solution or the organic solvent). As a result, as shown in FIG. 33, only the non-exposed portions 241 remains (or are left). Thereafter, the non-exposed portions 241 may be heated by heating the entire substrate 210 with a hot plate to thereby further harden the non-exposed portions 241. Consequently, the non-exposed portions 241 become a mask. The mask is referred to as "a first mask" for convenience. The ninth step is a first photosensitive film eliminating step of eliminating the portions 242 that have been exposed of the twelfth photosensitive film (=first photosensitive film) to thereby from the first mask above the piezoelectric material layer 232*a*. It should be noted that, when the twelfth photosensitive film is composed of the negative type photoresist, the twelfth photosensitive film is exposed in such a manner that the exposed portions 242 becomes non-exposed portions and the non-exposed portions 241 becomes exposed portions, and the non-exposed portions of the twelfth photosensitive film are eliminated to thereby form the first mask above the piezoelectric material layer 232*a*.

Subsequently, in a case in which the middle layer for reaction prevention HB has been formed, the middle layer for reaction prevention HB is eliminated using a method similar to the method used in the first embodiment. This step for eliminating the middle layer for reaction prevention HB is referred to as a middle layer for reaction prevention eliminating step.

10. Tenth (10 th) Step (Piezoelectric Material Layer Processing Step: Blast Processing)

Figure 34:
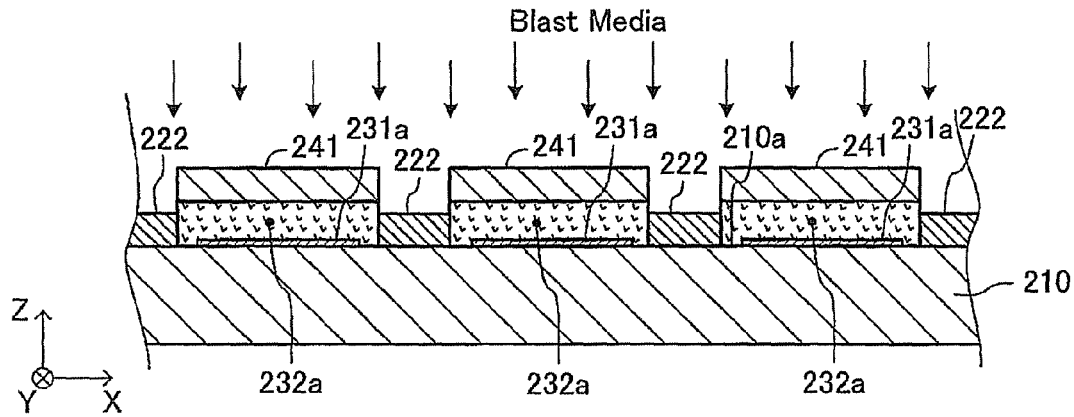
FIG. 34 is a figure to describe a tenth step of the second manufacturing method.

Subsequently, as shown in FIG. 34, a blast media is blasted (injected) toward "the first principal surface 210*a* (actually, to an upper surface of the piezoelectric material layer 232*a* and an upper surface of the exposed portions 222)" from the position above the first principal surface 210*a*. That is, a blast processing is performed. As a result, portions of the piezoelectric material layer 232*a* where the non-exposed portions 241 do not exist (portions which are not covered by the non-exposed portions 241) is eliminated. Portions which are covered by the non-exposed portions 241 are not eliminated. The blast media used in this step is the same as the blast media used in the seventeenth step of the first manufacturing method. In addition, the way of the injection of the blast media in this step is the same as the way of the injection of the blast media in the seventeenth step of the first manufacturing method.

11. Eleventh (11th) Step (Exposed Portions 222 and Non-Exposed Portions 241 Eliminating Step)

Figure 35:
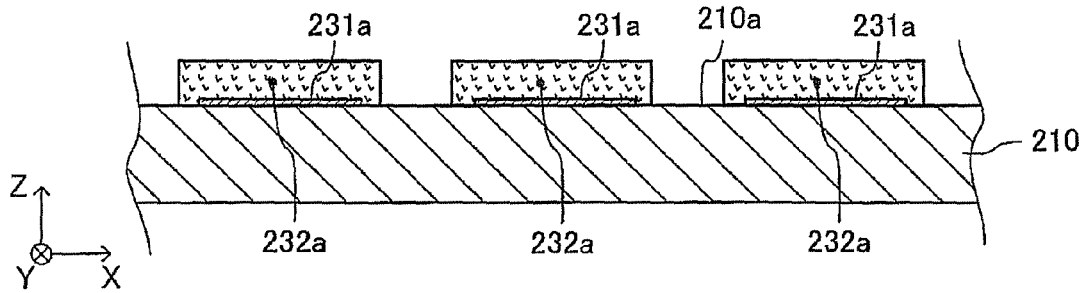
FIG. 35 is a figure to describe an eleventh step of the second manufacturing method.

Subsequently, the exposed portions 222 and the non-exposed portions 241 are eliminated (refer to FIG. 35). These masks are eliminated using a method depending on the material of the masks (such as, a method of eliminating them by dissolving them into the organic solvent, a chemical removal method, a method of eliminating them by heating and firing them). Further, these masks may be eliminated using a plasma ashing method, an organic substance cleaning method using an excimer laser irradiation, or the like. These masks may be eliminated using a combination of methods described above. In addition, in a case in which the middle layer for reaction prevention HB has been formed, the middle layer for reaction prevention HB is eliminated using a method similar to the method used in the first embodiment.

12. Twelfth (12th) Step (Firing Step)

Figure 36:
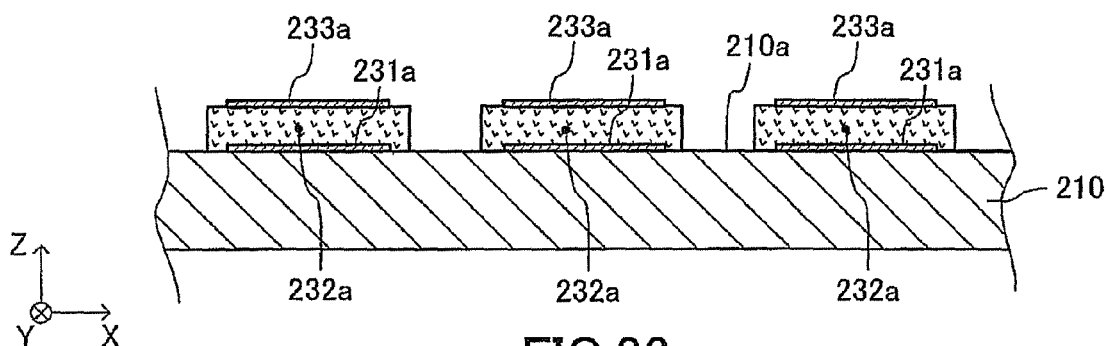
FIG. 36 is a figure to describe a twelfth step of the second manufacturing method.

Thereafter, as shown in FIG. 36, "conductive material films 233a which will become the second electrodes (upper electrodes)" are formed on (the upper surface of) the piezoelectric material layer 232a. Thereafter, the conductive material films 233a are fired to thereby form the piezoelectric membrane. Subsequently, the lower wiring electrodes (not shown) and the upper wiring electrodes (not shown) are formed. With these steps, the piezoelectric membrane type device is manufactured.

As described above, the second manufacturing method is a method for manufacturing the piezoelectric membrane type device which includes the substrate 210, and the piezoelectric device having the piezoelectric membrane 232a and provided on the first principal surface 210a of the substrate, the method comprising, (a) the substrate preparing step of preparing the substrate (refer to FIG. 25);

(b) the piezoelectric material layer forming step of forming, above the first principal surface of the substrate, the piezoelectric material layer which is the layer including the piezoelectric material to be changed into the piezoelectric membrane by being fired (refer to FIG. 30);

(c) the first mask forming step of forming the first mask above the piezoelectric material layer 32a (refer to FIGS. 31 to 33, and the non-exposed portions 241 as the first mask);

(d) the piezoelectric material layer processing step of eliminating the piezoelectric material layer existing in the portion on which the first mask does not exist by injecting the blast media including at least one of the abrasive grains and the organic solvent to the first principal surface of the substrate (refer to FIG. 34);

(e) the first mask eliminating step of eliminating the first mask (refer to FIG. 35); and (f) the firing step of firing the piezoelectric material layer (refer to FIG. 36).

According to the above second manufacturing method as well, the piezoelectric material layer which has not been fired is blast-processed in the piezoelectric material layer processing step. As a result, the blast processing can be completed within a short time.

According to the embodiments and the modified embodiments of the present invention, piezoelectric membrane type device having a very fine pattern of the piezoelectric device can be formed within the hollow portion projected region, with "high accuracy and efficiently". It should be noted that the present invention should not be limited to the embodiments and so on described above, but may include various modifications within the scope of the present invention. For example, the conductive film 31a and the piezoelectric material layer 32a may be simultaneously fired. Furthermore, the conductive film 31a for the first electrode, the piezoelectric material layer 32a, and the conductive film 33a for the second electrode may be simultaneously fired.

The invention claimed is:

1. A method for manufacturing a piezoelectric membrane type device which includes a substrate, and a piezoelectric device having a piezoelectric membrane and provided on a first principal surface of said substrate, said method comprising, (a) a substrate preparing step of preparing said substrate;

(b) a piezoelectric material layer forming step of forming, above said first principal surface of said substrate, a piezoelectric material layer which is a layer including a piezoelectric material to be changed into said piezoelectric membrane by being fired;

(c) a first mask forming step of forming a first mask above said piezoelectric material layer;

(d) a piezoelectric material layer processing step of injecting a blast media including at least one of abrasive grains and an organic solvent to said first principal surface of said substrate toward said piezoelectric material layer, which has not been fired and on which said first mask has been formed, so as to eliminate said piezoelectric material layer existing in a portion on which said first mask does not exist;

(e) a first mask eliminating step of eliminating said first mask; and (f) a firing step of firing said piezoelectric material layer.

2. A method for manufacturing a piezoelectric membrane type device according to claim 1, wherein said substrate includes a hollow portion;

said piezoelectric device comprises a first electrode, a second electrode, and said piezoelectric membrane which is sandwiched between said first electrode and said second electrode, and said piezoelectric device is disposed in such a manner that said piezoelectric device coincides with a hollow portion projected region which is a spatial region obtained by extending an image along a first principal surface orthogonal direction which is a direction orthogonal to said first principal surface, said image being obtained by projecting said hollow portion in said first principal surface orthogonal direction onto said first principal surface of said substrate;

said piezoelectric membrane type device changes a volume of said hollow portion in accordance with expansion and contraction of said piezoelectric device based on an application of voltage between said first electrode and said second electrode; and said substrate preparing step (a) is a step for preparing said substrate having said hollow portion, and said first mask forming step (c) includes (c1) a photosensitive film forming step of forming a first photosensitive film above said piezoelectric material layer;

(c2) a first exposure step of exposing said first photosensitive film existing outside of said hollow portion projected region without exposing said first photosensitive film existing inside of said hollow portion projected region by irradiating a light parallel to said first principal surface orthogonal direction to said substrate from a side of a second principal surface of said substrate opposed to said first principal surface; and (c3) an exposed first photosensitive film eliminating step of eliminating said exposed first photosensitive film to form said first mask on an upper surface of said piezoelectric material layer.

3. A method for manufacturing a piezoelectric membrane type device according to claim 2, further including;

(g) a second mask forming step of forming a second mask above said substrate after said substrate preparing step (a) and before said piezoelectric material layer forming step (b), by forming a second photosensitive film above said first principal surface of said substrate;

exposing said second photosensitive film existing outside of said hollow portion projected region without exposing said second photosensitive film existing inside of said hollow portion projected region by irradiating a light parallel to said first principal surface orthogonal direction to said substrate from said side of said second principal surface; and eliminating said second photosensitive film which is not exposed; and (h) a second mask eliminating step of eliminating said second mask after said piezoelectric material layer processing step (d).

4. A method for manufacturing a piezoelectric membrane type device according to claim 2, further including;

(i) a support forming step of forming a support in said hollow portion before said piezoelectric material layer processing step (d) by introducing a fluidic material into said hollow portion and hardening said fluidic material; and (j) a support eliminating step of eliminating said support after said piezoelectric material layer processing step (d).

5. A method for manufacturing a piezoelectric membrane type device according to claim 2, further including;

(k) a support forming step of forming a support having a light shielding function in said hollow portion before said first exposure step (c2) by introducing a fluidic material containing a light shielding material into said hollow portion and hardening said fluidic material; and (l) a support eliminating step of eliminating said support after said piezoelectric material layer processing step (d).

6. A method for manufacturing a piezoelectric membrane type device according to claim 2, further including;

(m) a third mask forming step of forming a third mask above said substrate after said substrate preparing step (a) and before said piezoelectric material layer forming step (b) by introducing a material containing a light shielding material into said hollow portion and forming a third photosensitive film above said first principal surface;

exposing said third photosensitive film existing outside of said hollow portion projected region without exposing said third photosensitive film existing inside of said hollow portion projected region by irradiating a light parallel to said first principal surface orthogonal direction to said substrate from said side of said second principal surface; and eliminating said third photosensitive film which is not exposed; and (n) a conductive material film forming step of forming a conductive material film which will become said first electrode on said first principal surface of said substrate and at a portion where said third mask does not exist, after said third mask forming step (m) and before said piezoelectric material layer forming step (b).

7. A method for manufacturing a piezoelectric membrane type device according to claim 6, further including;

(o) a third mask eliminating step of eliminating said third mask, after said conductive material film forming step (n) and before said piezoelectric material layer forming step (b), and wherein, said first exposure step (c2) is a step for exposing said first photosensitive film while utilizing said conductive material film as a mask.

8. A method for manufacturing a piezoelectric membrane type device according to claim 7, wherein said first exposure step (c2) is a step for exposing said first photosensitive film while utilizing, in addition to said conductive material film, said light shielding material introduced into said hollow portion in said third mask forming step (m) as a mask.

9. A method for manufacturing a piezoelectric membrane type device according to claim 8, wherein;

said material containing said light shielding material introduced into said hollow portion in said third mask forming step (m) is a fluidic material;

said third mask forming step (m) includes forming a hardened body by hardening said fluidic material introduced into said hollow portion before said irradiation of said light to expose said third photosensitive film; and said piezoelectric material layer processing step (d) is a step for injecting said blast media while said hardened body formed in said third mask forming step (m) is maintained in said hollow portion.

10. A method for manufacturing a piezoelectric membrane type device according to claim 8, wherein;

said material containing said light shielding material introduced into said hollow portion in said third mask forming step (m) is a fluidic material;

said method further including;

(p) a first hardened body forming step of forming a first hardened body by hardening said fluidic material introduced into said hollow portion in said third mask forming step (m), after said third mask forming step (m) and before said piezoelectric material layer processing step (d); and wherein;

said piezoelectric material layer processing step (d) is a step for injecting said blast media while said first hardened body is maintained in said hollow portion.

11. A method for manufacturing a piezoelectric membrane type device according to claim 7, further including;

(q) a material for exposure of said third photosensitive film eliminating step of eliminating said material containing said light shielding material introduced into said hollow portion in said third mask forming step (m) from said hollow portion, after said third mask forming step (m) and before said first exposure step (c2); and (r) a light shielding material re-filling step of re-filling a material containing a light shielding material into said hollow portion, after said material for exposure of said third photosensitive film eliminating step (q) and before said first exposure step (c2); and wherein;

said first exposure step (c2) is a step for exposing said first photosensitive film while utilizing, in addition to said conductive material film, said light shielding material re-filled into said hollow portion in said light shielding material re-filling step (r) as a mask.

12. A method for manufacturing a piezoelectric membrane type device according to claim 11, wherein;

said material containing said light shielding material re-filled into said hollow portion in said light shielding material re-filling step (r) is a fluidic material;

said method further including;

(s) a second hardened body forming step of forming a second hardened body by hardening said fluidic material re-filled into said hollow portion in said light shielding material re-filling step (r), after said light shielding material re-filling step (r) and before said piezoelectric material layer processing step (d); and wherein;

said piezoelectric material layer processing step (d) is a step for injecting said blast media while said second hardened body is maintained in said hollow portion.

13. A method for manufacturing a piezoelectric membrane type device according to claim 7, further including;

(t) a second mask forming step of forming a second mask on said upper surface of said substrate, after said third mask eliminating step (o) and before said piezoelectric material layer forming step (b), by forming a second photosensitive film above said first principal surface;

irradiating a light parallel to said first principal surface orthogonal direction to said substrate from said side of said second principal surface to expose said second photosensitive film existing outside of said hollow portion projected region without exposing said second photosensitive film existing inside of said hollow portion projected region using at least said conductive material film as a mask; and eliminating said second photosensitive film which is not exposed; and (u) a second mask eliminating step of eliminating said second mask, after said piezoelectric material layer processing step (d).

14. A method for manufacturing a piezoelectric membrane type device according to claim 2, further including;

(v) a middle layer forming step of forming a middle layer for reaction prevention on said piezoelectric material layer to avoid occurring dissolution reaction caused by a contact between said piezoelectric material layer and said first photosensitive film, after said piezoelectric material layer forming step (b) and before said photosensitive film forming step (c1).

15. A method for manufacturing a piezoelectric membrane type device according to claim 14, wherein;

said exposed first photosensitive film eliminating step (c3) or said piezoelectric material layer processing step (d) includes a middle layer for reaction prevention eliminating step of eliminating said middle layer for reaction prevention existing outside of said hollow portion projected region without eliminating said middle layer for reaction prevention existing inside of said hollow portion projected region.

16. A method for manufacturing a piezoelectric membrane type device according to claim 2, wherein;

said substrate comprises a plurality of said hollow portions; and said substrate preparing step (a) is a step for forming said substrate in such a manner that said plurality of said hollow portions are arranged in a direction along said first principal surface with a predetermined interval therebetween.

17. A method for manufacturing a piezoelectric membrane type device according to claim 1, wherein;

said first mask forming step (c) includes (c4) a photosensitive film forming step of forming a first photosensitive film above said piezoelectric material layer;

(c5) an exposure step of exposing a portion of said first photosensitive film; and (c6) a first photosensitive film eliminating step of forming a first mask above said piezoelectric material layer by eliminating either a portion which was exposed in said first photosensitive film or a portion which was not exposed in said first photosensitive film;

said method further including;

(w) a middle layer forming step of forming a middle layer for reaction prevention on said piezoelectric material layer to avoid occurring dissolution reaction caused by a contact between said piezoelectric material layer and said first photosensitive film, after said piezoelectric material layer forming step (b) and before said photosensitive film forming step (c4).

18. A method for manufacturing a piezoelectric membrane type device according to claim 3, further including;

(i) a support forming step of forming a support in said hollow portion before said piezoelectric material layer processing step (d) by introducing a fluidic material into said hollow portion and hardening said fluidic material; and (j) a support eliminating step of eliminating said support after said piezoelectric material layer processing step (d).

19. A method for manufacturing a piezoelectric membrane type device according to claim 3, further including;

(k) a support forming step of forming a support having a light shielding function in said hollow portion before said first exposure step (c2) by introducing a fluidic material containing a light shielding material into said hollow portion and hardening said fluidic material; and (l) a support eliminating step of eliminating said support after said piezoelectric material layer processing step (d).

20. A method for manufacturing a piezoelectric membrane type device according to claim 3, further including;

(v) a middle layer forming step of forming a middle layer for reaction prevention on said piezoelectric material layer to avoid occurring dissolution reaction caused by a contact between said piezoelectric material layer and said first photosensitive film, after said piezoelectric material layer forming step (b) and before said photosensitive film forming step (c1).

21. A method for manufacturing a piezoelectric membrane type device according to claim 1, wherein the piezoelectric material layer is formed as a contiguous layer over said first principal surface.

* * * * *